(12) United States Patent
Kitagawa et al.

(10) Patent No.: US 7,489,018 B2
(45) Date of Patent: Feb. 10, 2009

(54) TRANSISTOR

(75) Inventors: Mitsuhiko Kitagawa, Tokyo (JP);
Takashi Nishimura, Hyogo-ken (JP);
Yusuke Kawaguchi, Kanagawa-ken
(JP); Syotaro Ono, Kanagawa-ken (JP)

(73) Assignee: Kabushiki Kaisha Toshiba, Minato-ku,
Tokyo (JP)

( * ) Notice: Subject to any disclaimer, the term of this patent is extended or adjusted under 35 U.S.C. 154(b) by 323 days.

(21) Appl. No.: 11/405,672

(22) Filed: Apr. 18, 2006

(65) Prior Publication Data

US 2006/0231894 A1    Oct. 19, 2006

(30) Foreign Application Priority Data

Apr. 19, 2005   (JP)   ............... 2005-121237
Apr. 12, 2006   (JP)   ............... 2006-109949

(51) Int. Cl.
H01L 27/082   (2006.01)
H01L 27/102   (2006.01)
H01L 29/70   (2006.01)
H01L 31/11   (2006.01)

(52) U.S. Cl. ................ 257/578; 257/211; 438/270

(58) Field of Classification Search ............ 257/211, 257/335, 387, 578; 438/270, 275, 277
See application file for complete search history.

(56) References Cited

U.S. PATENT DOCUMENTS

| | | | |
|---|---|---|---|
| 5,300,448 A | 4/1994 | Merchant et al. | |
| 5,767,547 A | 6/1998 | Merchant et al. | |
| 6,164,781 A | 12/2000 | Tsang et al. | |
| 6,294,818 B1 | 9/2001 | Fujihara et al. | |
| 6,573,144 B2 * | 6/2003 | Takahashi et al. | ........... 438/270 |
| 6,777,746 B2 | 8/2004 | Kitagawa et al. | |
| 2006/0043428 A1 * | 3/2006 | Nishimura et al. | .......... 257/211 |
| 2007/0158700 A1 * | 7/2007 | Koh et al. | .................... 257/288 |

FOREIGN PATENT DOCUMENTS

JP   2004-006731   1/2004

* cited by examiner

*Primary Examiner*—Phuc T Dang
(74) *Attorney, Agent, or Firm*—Banner & Witcoff, Ltd

(57) ABSTRACT

A transistor comprises: an insulating layer; a semiconductor layer provided on a major surface of the insulating layer; a gate insulating layer provided on the base region; and a gate electrode provided on the gate insulating layer. The semiconductor layer has a source portion having a plurality of source regions of a first conductivity type and a plurality of base contact regions of a second conductivity type, the source regions being alternated with the base contact regions, a drain portion of the first conductivity type, and a base region of the second conductivity type provided between the source portion and the drain portion, the base region being in contact with the source regions and the base contact regions. A junction between the source regions and the base region is closer to the drain portion side than a junction between the base contact regions and the base region.

20 Claims, 29 Drawing Sheets

20V-0.1A
BACK GATE OFFSET STRUCTURE

TRANSISTOR

CROSS-REFERENCE TO RELATED APPLICATION

This application is based upon and claims the benefit of priority from the prior Japanese Patent Application No. 2005-121237, filed on Apr. 19, 2005, and the prior Japanese Patent Application No. 2006-109949, filed on Apr. 12, 2006; the entire contents of which are incorporated herein by reference.

BACKGROUND OF THE INVENTION

Switching devices having both excellent operating characteristics and reliability are required in applications including bus switches in personal computers, antenna switches in mobile phones, and switches in automatic test equipment (ATE) used for testing ICs and LSIs. Photorelays and analog switches based on field effect transistors are expected as these switching devices instead of conventional mechanical contact relays. Power MOSFET devices are also required to have a high withstand voltage and a low on-resistance (Ron) and be capable of fast operation.

To meet these expectations, one of the inventors invented a switching device based on a lateral field effect transistor having a low on-resistance and a small output capacitance (Cout) (e.g., JP 2004-006731A (hereinafter referred to as Patent Document 1)).

For example, in the case of a transistor disclosed in FIG. 33 or 34 of Patent Document 1, the $n^+$-type source regions 5 and the $p^+$-type contact layers 6 are located equidistantly from the drain 7. That is, the source regions 5 and the contact layers 6 are both in contact with the base layer 4 along a common straight line. However, such collinear alignment of contact layers 6 with the source regions 5 narrows the effective channel width. More specifically, the path of electron current flowing from the base layer 4 into the source in the on-state is limited to only the portion of the $n^+$-type source regions 5. The portion where the $p^+$-type contact layers 6 are in contact with the base layer 4 does not serve as an outflow path for electrons. Therefore the effective channel width is narrowed, which results in an unfavorable structure from the viewpoint of reducing on-resistance.

SUMMARY OF THE INVENTION

According to an aspect of the invention, there is provided a transistor comprising: an insulating layer; a semiconductor layer provided on a major surface of the insulating layer, the semiconductor layer having a source portion having a plurality of source regions of a first conductivity type and a plurality of base contact regions of a second conductivity type, the source regions being alternated with the base contact regions, a drain portion of the first conductivity type, and a base region of the second conductivity type provided between the source portion and the drain portion, the base region being in contact with the source regions and the base contact regions; a gate insulating layer provided on the base region; and a gate electrode provided on the gate insulating layer, a junction between the source regions and the base region being closer to the drain portion side than a junction between the base contact regions and the base region.

According to other aspect of the invention, there is provided a transistor comprising: a supporting substrate; an insulating layer provided on a major surface of the supporting substrate, the insulating layer having a first major surface and a second major surface that is in contact with the major surface of the supporting substrate; a semiconductor layer provided on the first major surface of the insulating layer, the semiconductor layer having a source portion, a drain portion of a first conductivity type, and a base region of a second conductivity type provided between the source portion and the drain portion; a gate insulating layer provided on the base region; a first gate electrode provided on the gate insulating layer; a second gate electrode provided on a surface of the supporting substrate, the surface being in the opposite side of the major surface of the supporting substrate; and a dielectric substance provided in a part of the supporting substrate, the dielectric substance being in contact with a portion in the second major surface of the insulating layer, the portion being opposed to the drain portion.

According to other aspect of the invention, there is provided a transistor comprising: an insulating layer having a first major surface and a second major surface that is on the opposite side of the first major surface; a semiconductor layer provided on the first major surface of the insulating layer, the semiconductor layer having a source portion, a drain portion of a first conductivity type, and a base region of a second conductivity type provided between the source portion and the drain portion; a gate insulating layer provided on the base region; a first gate electrode provided on the gate insulating layer; and a second gate electrode provided not on a portion in the second major surface side of the insulating layer that is opposed to the drain portion but on a portion in the second major surface side of the insulating layer that is opposed to the base region.

DETAILED DESCRIPTION OF THE INVENTION

Embodiments of the invention will now be described with reference to the drawings.

FIRST EMBODIMENT

Figure 1A:
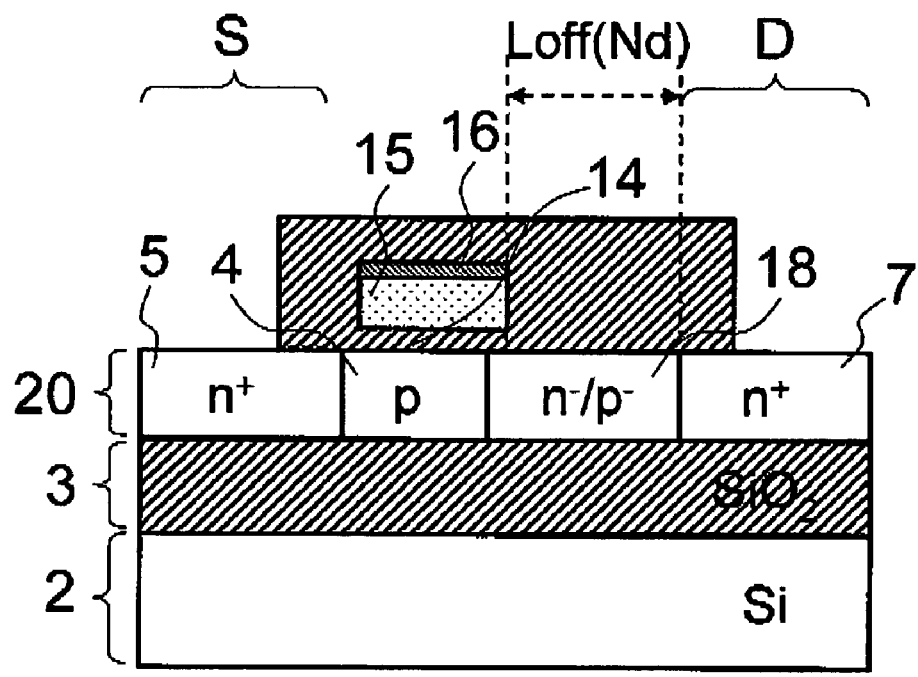
FIG. 1A is a cross section of a field effect transistor according to a first embodiment of the invention.
Figure 1B:
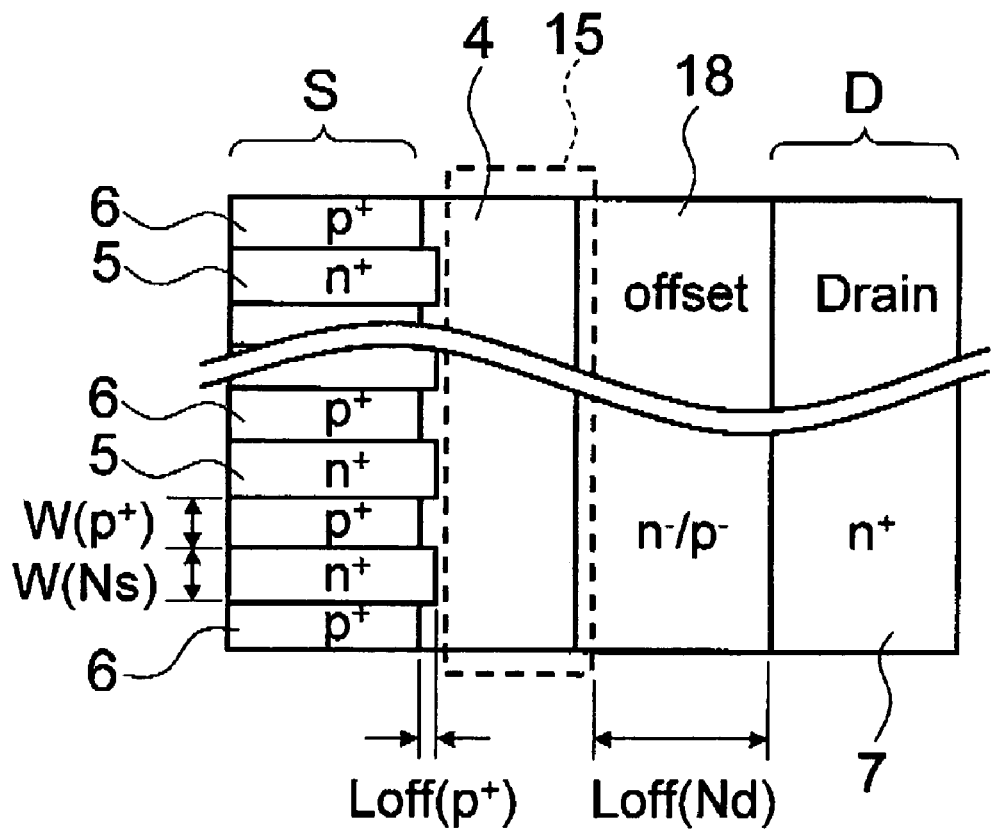
FIG. 1B is a diagram illustrating the planar arrangement of the semiconductor portion of the field effect transistor.

FIG. 1 is a diagram illustrating a transistor according to a first embodiment of the invention. More specifically, FIG. 1A is a cross section of the field effect transistor, and FIG. 1B is a diagram illustrating the planar arrangement of the semiconductor portion of the field effect transistor.

The field effect transistor of this embodiment is formed in a so-called SOI (Silicon On Insulator) layer. More specifically, an SOI layer 20 made of silicon is provided on a supporting substrate 2 made of silicon via a buried insulating layer 3 made of silicon oxide. The SOI layer 20 has a source portion S, a drain portion D, and a p-type base region 4 and a drift region 18 provided therebetween.

The source portion S is configured so that $n^+$-type source regions 5 and $p^+$-type base contact regions 6 are alternated in a direction perpendicular to the channel. These $n^+$-type source regions 5 and $p^+$-type base contact regions 6 are both connected to a source electrode (not shown in FIGS. 1A-1B). The $p^+$-type base contact regions 6 serve to fix the potential of the p-type base region 4 to the source potential.

The drain portion D has an $n^+$-type drain region 7.

The p-type base region 4 is a semiconductor region where a channel is produced. The drift region 18 is made of $p^-$-type or $n^-$-type silicon having a higher resistance than the p-type base region 4 and serves to increase the withstand voltage of the transistor.

A gate electrode 15 is provided on the p-type base region 4 via a gate insulating film 14. On the gate electrode 15, a conducting layer 16 made of tungsten silicide (WSI) or the like may be provided in order to decrease the connection resistance with a gate interconnect, not shown.

When a prescribed voltage is applied to the gate electrode 15, a channel is produced in the p-type base region 4 and this field effect transistor is turned on, allowing a current to flow between the source regions 5 and the drain region 7. The $p^+$-type base contact regions 6 serve to fix the potential of the p-type base region 4 to the source potential in the off-state and prevent the parasite bipolar effect in the off-state and at the switching time, and thereby the withstand voltage of the transistor may be increased.

In this embodiment, the $p^+$-type base contact regions 6 are offset relative to the $n^+$-type source regions 5. More specifically, as shown in FIG. 1B, the $p^+$-type base contact regions 6 are located more distant from the drain portion D than the $n^+$-type source regions 5 by an offset Loff($p^+$). Junction between the $n^+$-type source regions 5 and the p-type base region 4 are closer to the drain region 7 side than junction between the $p^+$-type base contact regions 6 and the p-type base region 4. This allows for ensuring an effective channel area in the on-state, thereby achieving a high switching withstand voltage while preventing the increase of on-resistance.

If the $p^+$-type base contact regions 6 protrude toward the base region 4 relative to the source region 5, the effective channel width is decreased. In this case, on-resistance may be increased.

Figure 13A:
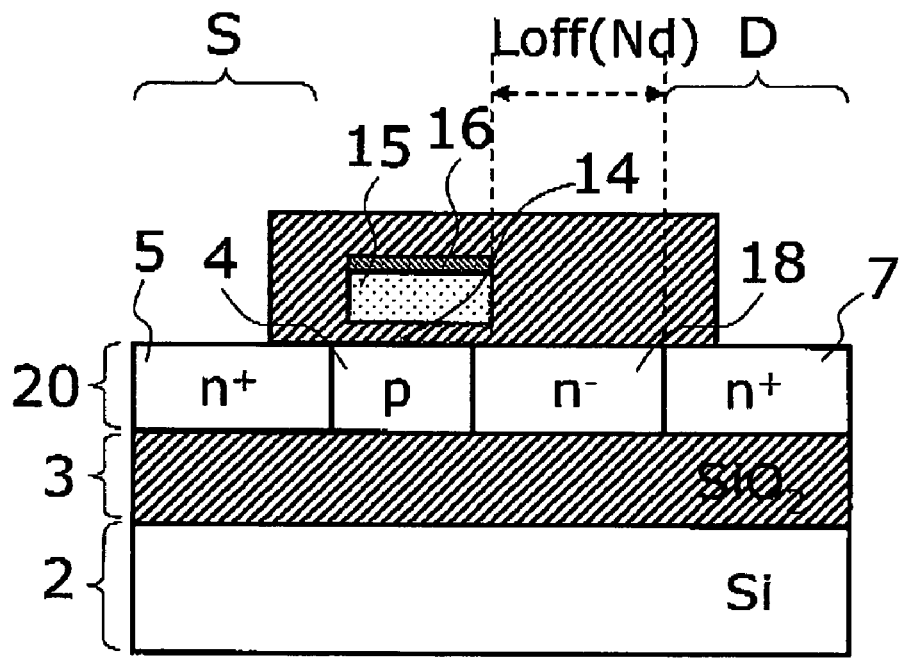
FIG. 13A is a cross section of a conventional field effect transistor formed by the conventional technique.
Figure 13B:
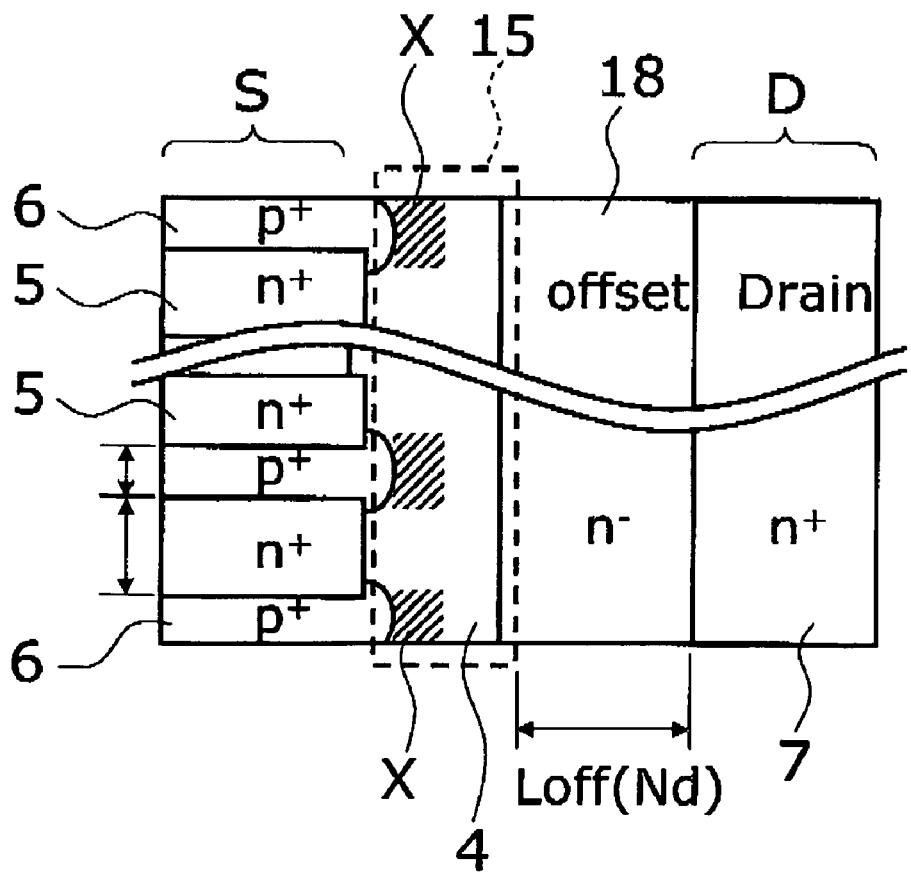
FIG. 13B is a planar diagram of the semiconductor portion thereof.

More specifically, when the conventional technique is used to form this structure, a problem occurs that the $p^+$-type contact layers 6 are more likely to protrude toward the base region 4 than the source regions 5. FIGS. 13A and 13B are diagrams showing such a field effect transistor formed by the conventional technique.

More specifically, in forming the structure shown in FIG. 33 or 34 of Patent Document 1, one ordinary skilled in the art usually adopts a technique of forming the $n^+$-type source regions 5 and $p^+$-type contact layers 6 by using the polysilicon pattern of a gate electrode 15 formed on the SOI layer 20 as a mask to selectively introduce n-type and p-type impurities into the source portion. In this case, conventionally, arsenic (As) is used for n-type impurities, and boron (B) is used for p-type impurities.

However, in silicon, boron is more likely to diffuse than arsenic. Therefore when these impurities are introduced using the same gate mask, boron diffuses a longer distance laterally, that is, boron diffuses toward a portion under the gate mask. As a result, as shown in FIGS. 13A and 13B, the p$^+$-type contact layers 6 will protrude from the source regions 5 toward the base region 4.

This protrusion of the p$^+$-type contact layers 6 further decreases the effective channel width. More specifically, in the portion where the p$^+$-type contact layers 6 protrude, no inversion channel is produced even if an electric field is applied from the gate electrode 15. Hence the regions X hatched in FIGS. 13A and 13B are ineffective for electron flow, causing a problem that the on-resistance is further increased.

On the contrary, in the field effect transistor of this embodiment as illustrated in FIG. 1, the p$^+$-type base contact regions 6 are set back relative to the n$^+$-type source regions 5. As a result, the effective channel width and the channel region can be increased to reduce on-resistance.

Furthermore, in this embodiment, the width W(Ns) of the source region 5 can be decreased to improve the switching withstand voltage. More specifically, even if the offset Loff (p$^+$) of the base contact regions 6 is zero, the width W(Ns) of the source region 5 can be decreased to significantly improve the switching withstand value of the transistor.

These effects are described below.

Figure 2A:
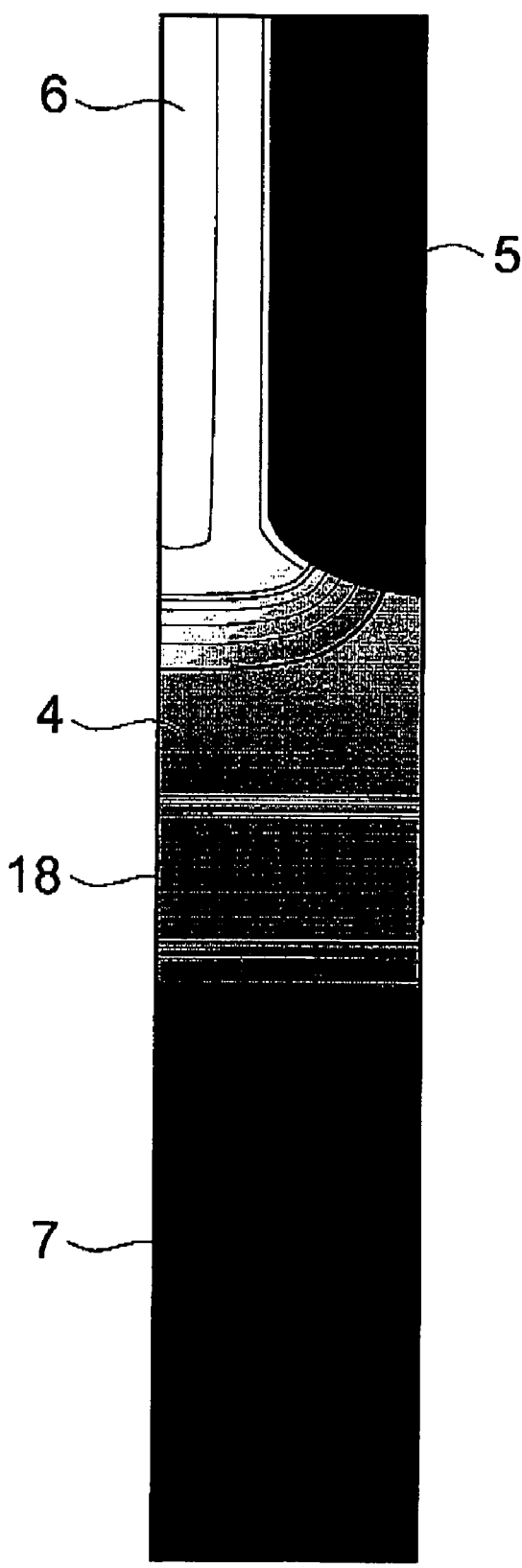
FIGS. 2A and 2B are diagrams illustrating in contour the planar distribution of impurity concentration in the SOI layer of the transistor of a comparative example and of the first embodiment, respectively.
Figure 2B:
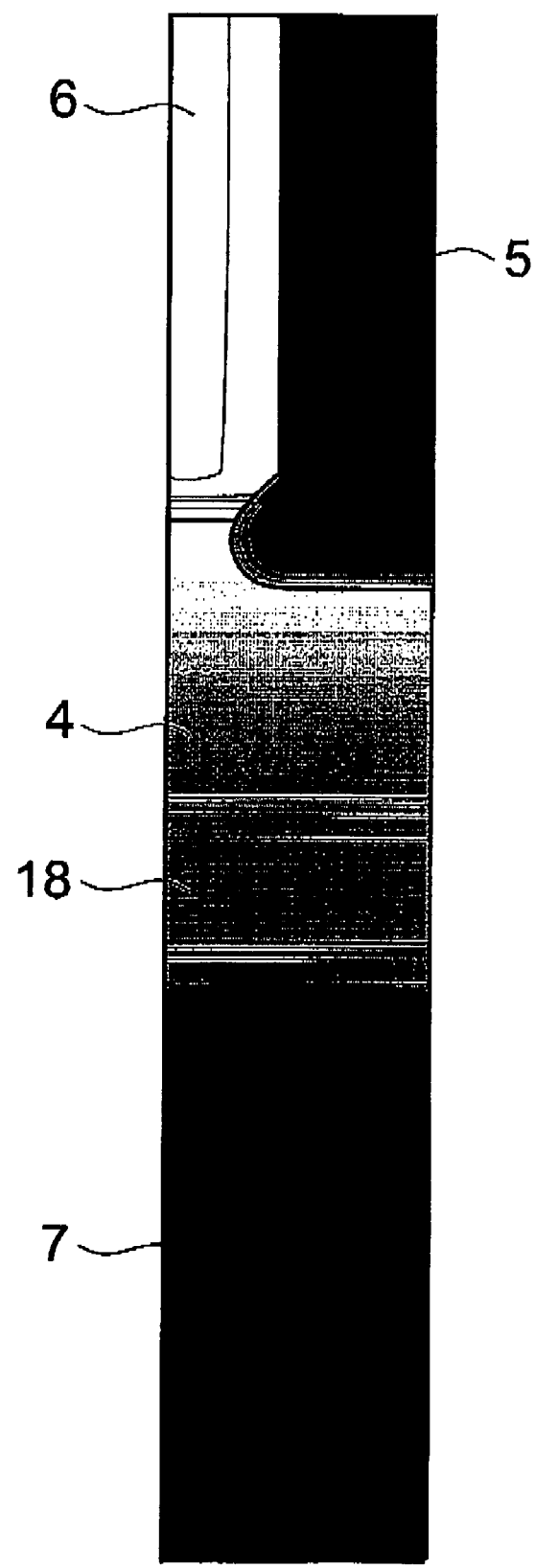

FIGS. 2A and 2B are diagrams illustrating in contour the planar distribution of impurity concentration in the SOI layer of the transistor of a comparative example and of this embodiment, respectively. These diagrams are shaded darker as the concentration of n-type impurities is higher, and lighter as the concentration of p-type impurities is higher.

FIG. 2A shows the distribution of impurity concentration in the case where n-type and p-type impurities are introduced using a polysilicon gate as a common mask as described above with reference to FIGS. 13A and 13B. It can be seen that p-type impurities in the p$^+$-type base contact region 6 protrude toward the base region 4 and narrow the junction between the n$^+$-type source region 5 and the base region 4. This protrusion of the p$^+$-type base contact region 6 narrows the effective channel width and increases the on-resistance.

On the contrary, FIG. 2B shows the distribution of impurity concentration in the transistor of this embodiment. In this embodiment, the p$^+$-type base contact region 6 is formed to recede relative to the n$^+$-type source region 5. As a result, as shown in FIG. 2B, n-type impurities in the n$^+$-type source region 5 spread to the junction between the p$^+$-type base contact region 6 and the base region 4, and the effective channel width is expanded significantly.

Figure 3A:
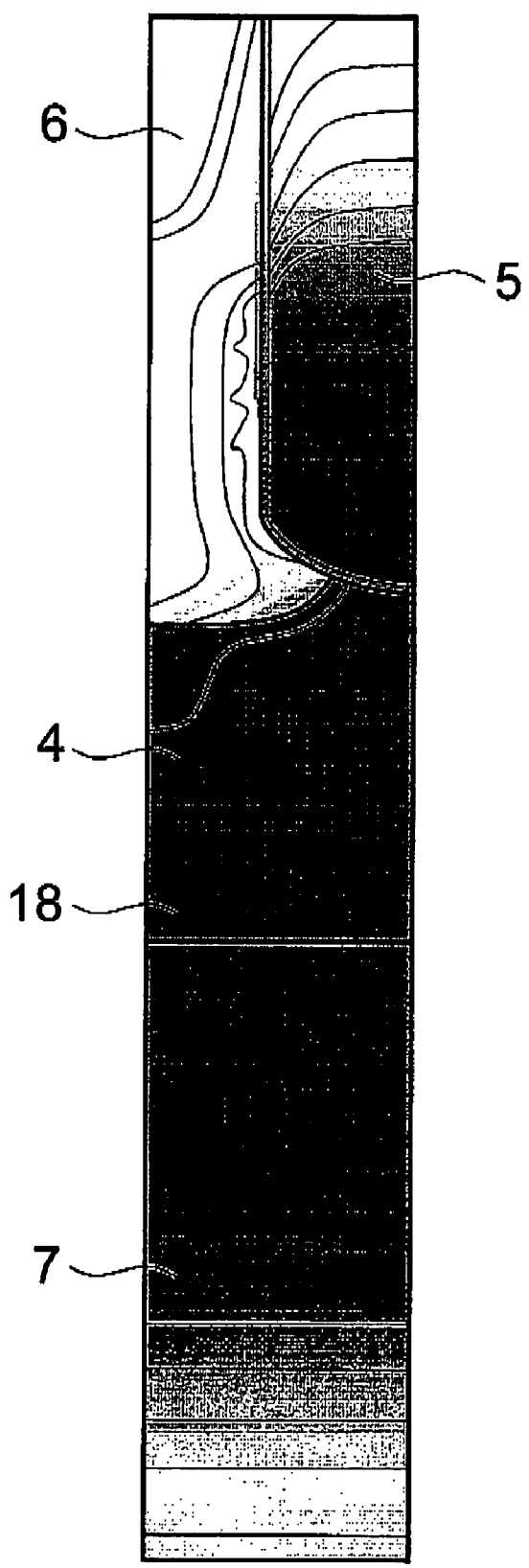
FIGS. 3A and 3B are diagrams illustrating the density distribution of electron current in the transistor of the comparative example illustrated in FIG. 2A and of the first embodiment illustrated in FIG. 1, respectively.
Figure 3B:
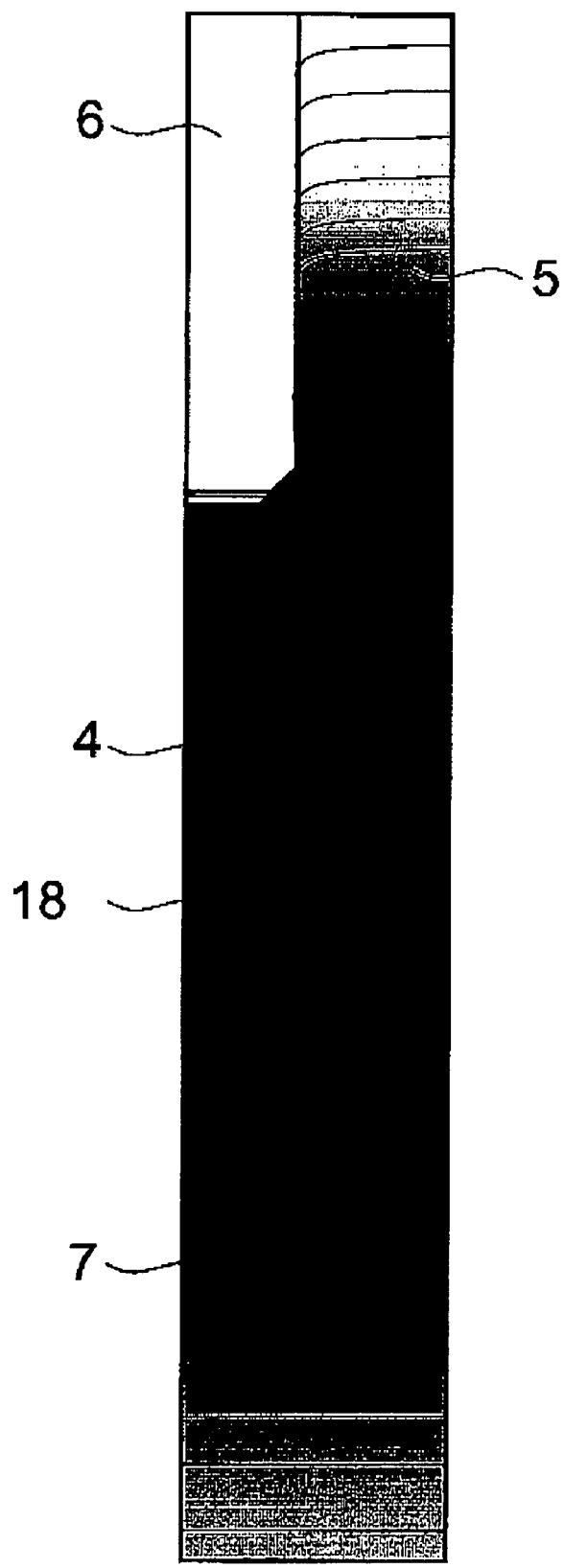

FIGS. 3A and 3B are diagrams illustrating the density distribution of electron current in the transistor of the comparative example illustrated in FIG. 2 and of this embodiment illustrated in FIG. 1, respectively. More specifically, these diagrams show in contour the planar density distribution of electron current in the on-state. These diagrams are shaded darker as the density of electron current is higher, and lighter as the density is lower.

In the case of the transistor of the comparative example shown in FIG. 3A, it can be seen that the flow path of electron current flowing from the base region 4 into the source region 5 is significantly narrowed, because the p$^+$-type base contact region 6 protrudes and extends ahead of the n$^+$-type source region 5. This narrowing of the flow path of electron current decreases the average density of electron current in the p-type base region 4, causing a problem of increased on-resistance. This problem becomes more serious as the pattern width W(Ns) (see FIG. 1B) of the n$^+$-type source region 5 is made narrower.

On the contrary, in the transistor of this embodiment, as shown in FIG. 3B, the p$^+$-type base contact region 6 is offset away to significantly expand the flow path of electron current flowing into the n$^+$-type source region 5, thereby achieving a high electron current density throughout the p-type base region 4. As a result, the on-resistance can be significantly reduced. The transistor of the comparative example shown in FIG. 3A has a drain current Id of only 0.063 ampere for a drain voltage Vd of 0.35 volt. However, in the transistor of this embodiment shown in FIG. 3B, the drain current Id is increased to 0.1045 ampere for a drain voltage Vd of 0.35 volt. That is, the on-resistance is reduced by nearly 40 percent relative to the comparative example.

In the case of a transistor where the source portion S does not include the p$^+$-type base contact region 6 but only includes the n$^+$-type source region 5, the drain current Id is 0.1064 ampere in the same condition. That is, the on-resistance can be reduced to nearly the same level in this embodiment as in the case without the p$^+$-type base contact region 6, and almost eliminate the increase of on-resistance due to the p$^+$-type base contact region 6. In other words, according to this embodiment, while preventing the increase of on-resistance, the p$^+$-type base contact region 6 can be provided to prevent the parasitic bipolar effect in the off-state and switching state and achieve a high switching withstand voltage.

Figure 4:
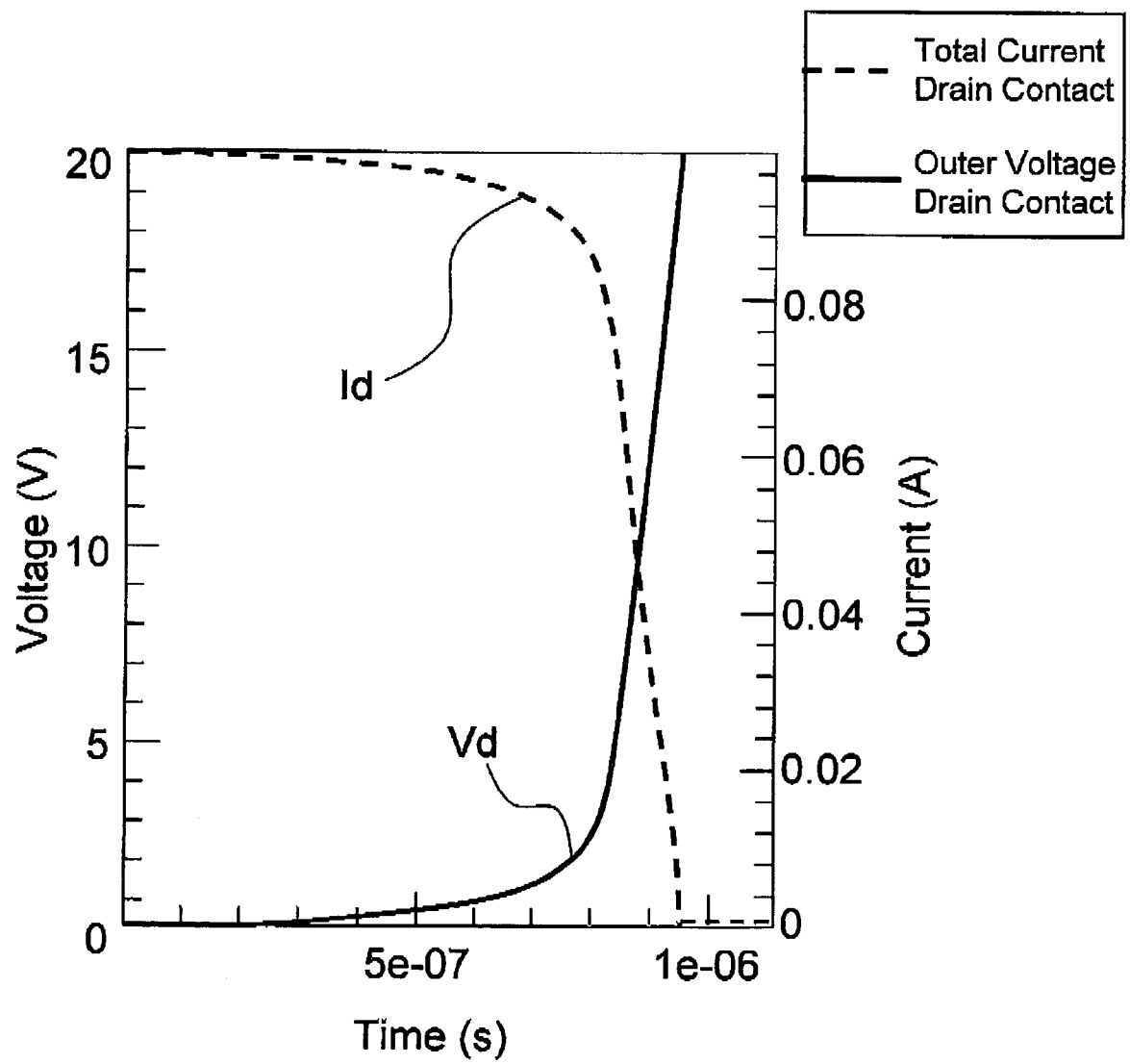
FIG. 4 is a graphical diagram illustrating the turn-off characteristic of the field effect transistor of the first embodiment of the invention.

FIG. 4 is a graphical diagram illustrating the turn-off characteristic of the field effect transistor of this embodiment. In this figure, the horizontal axis represents time, and the vertical axis represents current and voltage.

The current, which is nearly 0.1 ampere at zero volt in the on-state, is rapidly decreased in about 0.8 microsecond with the turn-off operation of the transistor and transitioned to zero ampere at 20 volts. This turn-off rate is comparable to that of the field effect transistor without having the p$^+$-type base contact region 6 in the source portion S. That is, according to this embodiment, while the p$^+$-type base contact region 6 is provided to fix the potential of the p-type base region 4, the on-resistance can be significantly reduced to decrease the CR (capacitance-resistance) product, thereby significantly improving the switching rate.

The field effect transistor of this embodiment can be manufactured by, for example, forming the p$^+$-type base contact regions 6 and the n$^+$-type source regions 5 using different masks as described below with reference to FIGS. 8A and 8B. More specifically, the p$^+$-type base contact regions 6 can be formed by selectively introducing p-type impurities into the source portion S with a mask having a narrow opening along the channel (horizontal direction in FIG. 1). On the other hand, the n$^+$-type source regions 5 can be formed by selectively introducing n-type impurities into the source portion S with a mask having a wide opening along the channel (horizontal direction in FIG. 1). This results in the structure as illustrated in FIG. 1, where the p$^+$-type base contact regions 6 are located more distant from the drain portion D than the n$^+$-type source regions 5.

More specifically, for example, a mask having a first opening is used to introduce p-type impurities into the source portion S, thereby forming the p$^+$-type contact regions 6. Subsequently, this mask is etched to expand the opening, through which n-type impurities can be introduced to form the n$^+$-type source regions 5.

Alternatively, a mask having a first opening is used to introduce n-type impurities into the source portion S, thereby forming the n$^+$-type source regions 5. Subsequently, another mask is overlaid on this mask to narrow the opening, through which p-type impurities can be introduced to form the p$^+$-type contact regions 6.

The structure parameters of the field effect transistor of this embodiment are described below more quantitatively.

Figure 5:
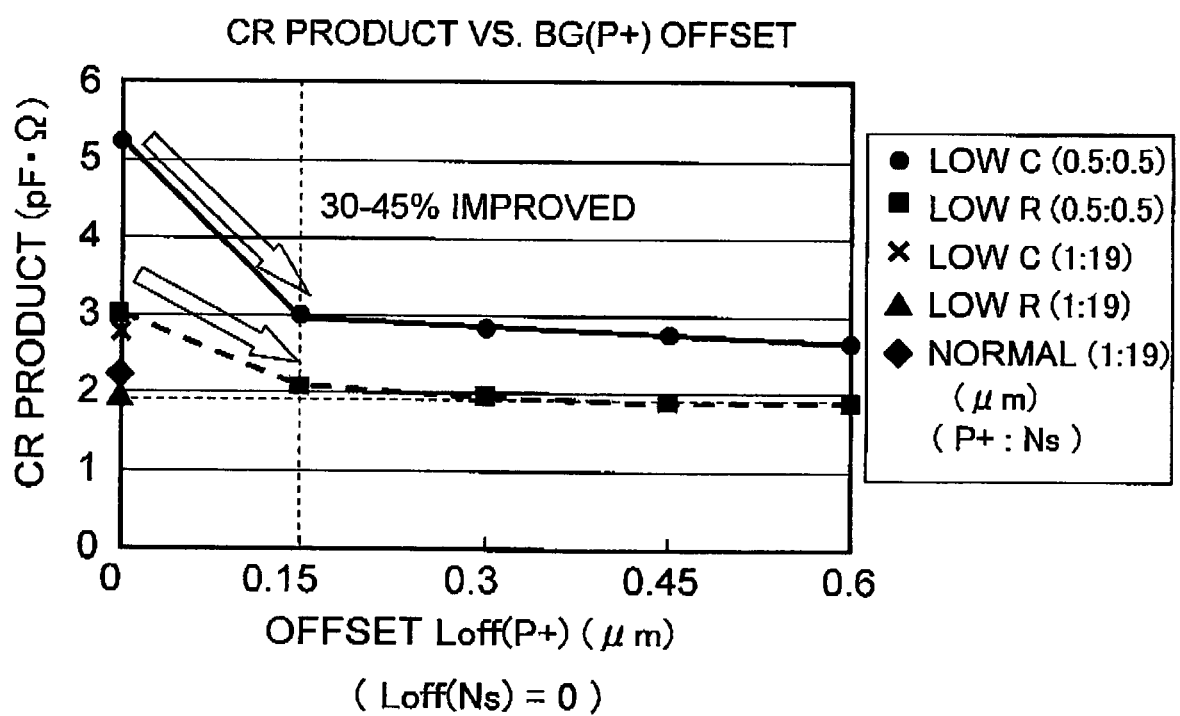
FIG. 5 is a graphical diagram illustrating the relationship between the offset of the $p^+$-type base contact regions 6 and the CR product of the transistor.

FIG. 5 is a graphical diagram illustrating the relationship between the offset of the $p^+$-type base contact regions 6 and the CR product of the transistor. In this figure, the horizontal axis represents the offset Loff($p^+$), and the vertical axis represents the CR product (pF·Ω).

In the legend of this figure, "NORMAL" refers to a structure in which the gate has a length (horizontal length in FIGS. 1A and 1B) of 1 micrometer and a width (vertical length in FIG. 1B) of 2700 micrometers. "LOW C" refers to a structure in which the gate has a length of 1 micrometer and a width of 1400 micrometers for decreasing capacitance. "LOW R" refers to a structure in which the gate has a length of 1 micrometer and a width of 5500 micrometers for decreasing resistance.

The attached label "(0.5:0.5)" indicates that the width W($p^+$) of the $p^+$-type base contact region 6 (see FIG. 1B) is 0.5 micrometer and the width W(Ns) of the $n^+$-type source region 5 (see FIG. 1B) is also 0.5 micrometer. Likewise, the label "(1:19)" indicates that the width W($p^+$) of the $p^+$-type base contact region 6 (see FIG. 1B) is 1 micrometer and the width W(Ns) of the $n^+$-type source region 5 (see FIG. 1B) is 19 micrometers. That is, the code "(0.5:0.5)" corresponds to the structure in which the $p^+$-type base contact regions 6 and the $n^+$-type source regions 5 are downsized in their width direction.

As can be seen from FIG. 5, as the offset Loff($p^+$) of the $p^+$-type base contact regions 6 is increased from zero to 0.15 micrometer, the CR product of the structure with the base contact regions 6 and source regions 5 being downsized ("(0.5:0.5)") rapidly decreases. Presumably, this is primarily due to the decrease of on-resistance (Ron) as described above with reference to FIGS. 2 and 3. As the offset Loff($p^+$) is further increased, the CR product continues to slightly decrease, but the variation is gradual. That is, from the viewpoint of CR product or on-resistance, the offset Loff($p^+$) is preferably 0.15 micrometer or more in the downsized structure.

Figure 6:
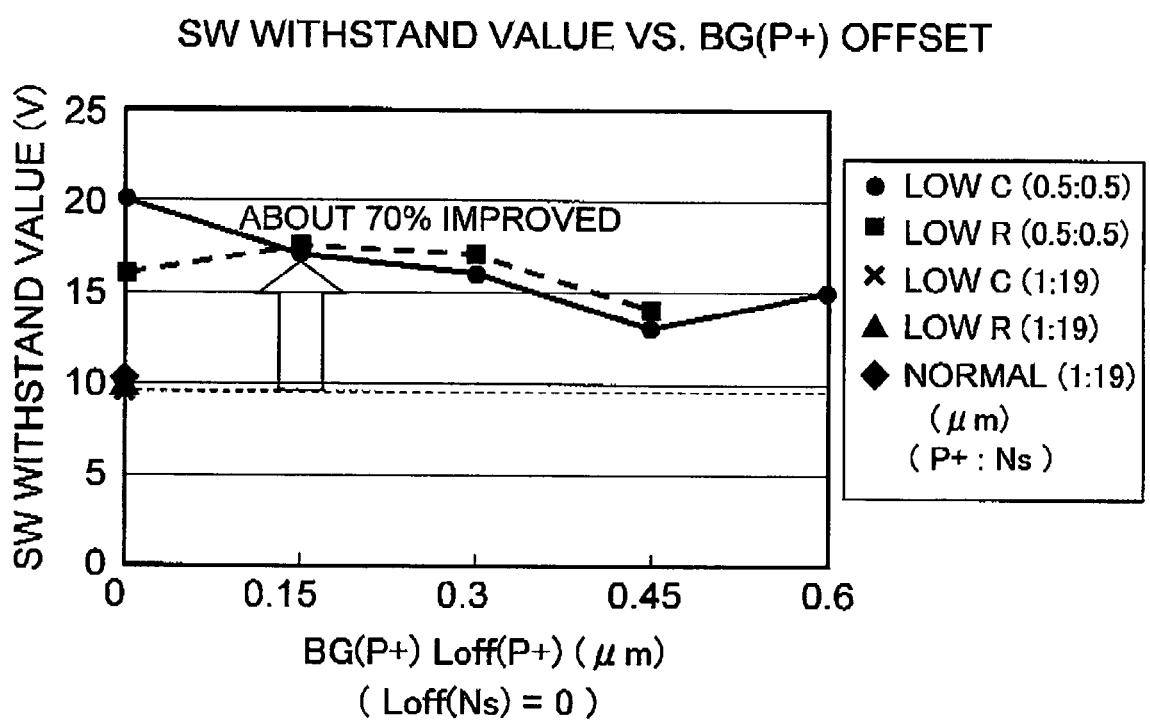
FIG. 6 is a graphical diagram illustrating the relationship between the offset of the $p^+$-type base contact regions 6 and the switching withstand value of the transistor.

FIG. 6 is a graphical diagram illustrating the relationship between the offset of the $p^+$-type base contact regions 6 and the switching withstand value of the transistor. In this figure, the horizontal axis represents the offset Loff($p^+$), and the vertical axis represents the switching withstand value (volts). The legend of FIG. 6 is the same as described above with reference to FIG. 5.

The switching withstand value is significantly higher for the downsized structure ("(0.5:0.5)") than for the non-downsized structure ("(1:19)"). Furthermore, it can be seen that, when the offset is zero (Loff($p^+$)=0) or about 0.15 to 0.3 micrometer, the downsized structure shows an improvement of about 70 percent over the non-downsized structure.

The results shown in FIGS. 5 and 6 can be summarized as follows. When the width W($p^+$) of the base contact region 6 and the width W(Ns) of the source region 5 are downsized and the offset is set to 0.15 to 0.3 micrometers, the on-resistance can be effectively decreased to achieve a sufficiently high switching withstand value while preventing the increase of CR product.

Next, the effect of downsizing the width of the source region 5 is further described.

To actually use a device having a rated drain voltage of 20 volts, the switching withstand value for the drain voltage must be 20 volts or more. If the source region 5 has a large pattern width W(Ns), the bipolar parasite effect at the switching time will cause breakdown. For avoiding this breakdown, it is necessary to ensure tight contact of the p-type base region 4 to the source electrode and to narrow the spacing of this contact with the base region 4, that is, to narrow the pattern width W(Ns) of the source region 5.

Figure 7:
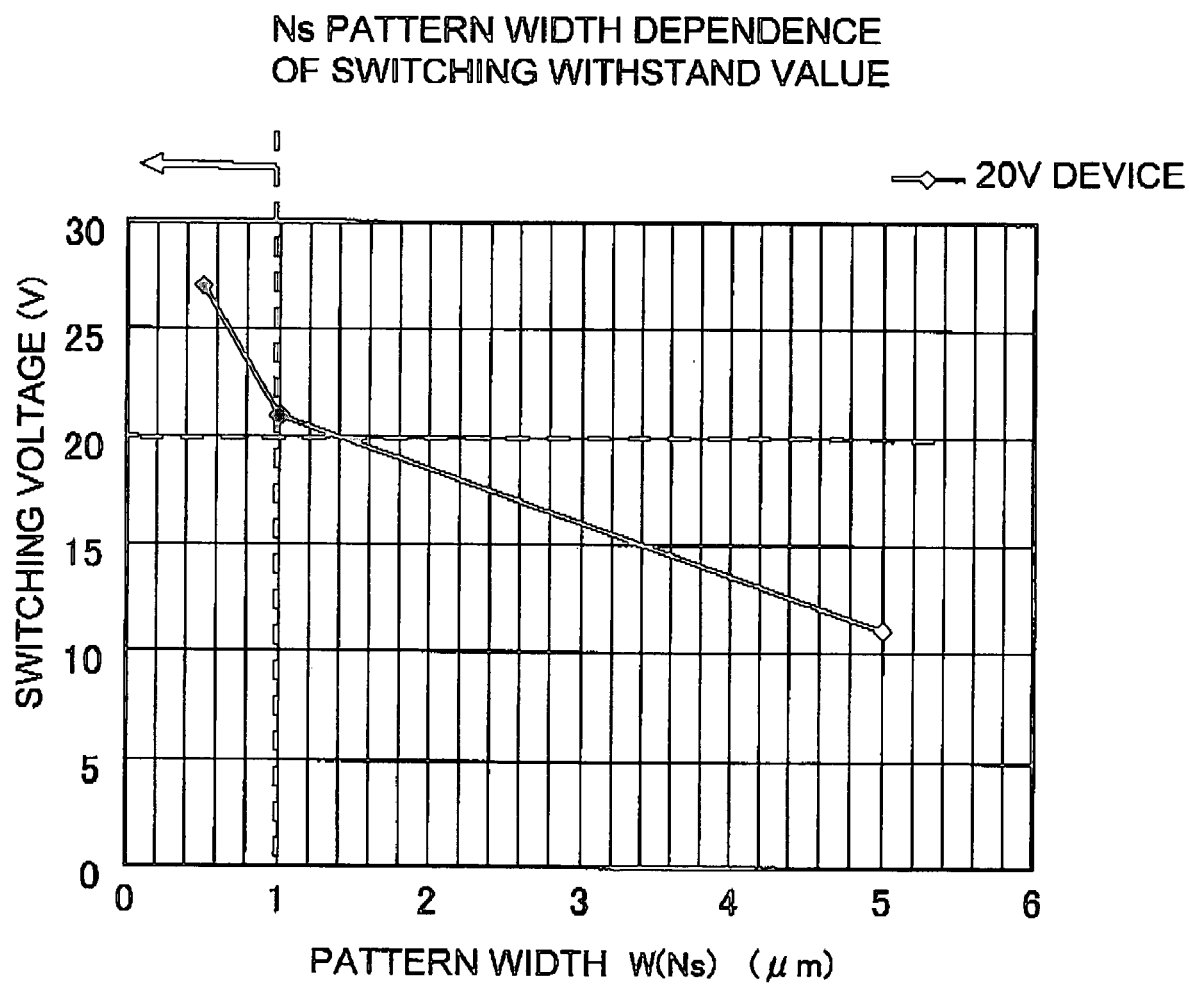
FIG. 7 shows the relationship between the pattern width of the source region 5 and the switching breakdown voltage at the time of switching of a 20V device of the field effect transistors of the first embodiment.

FIG. 7 shows the relationship between the pattern width of the source region 5 and the switching breakdown voltage at the time of switching of a 20-volt device of the field effect transistors of this embodiment. In this figure, the horizontal axis represents the width W(Ns) of the source region 5, and the vertical axis represents the switching voltage of the field effect transistor.

As can be seen from this graph, a switching voltage withstand value of 20 volts or more allowing for actual use can be obtained when the pattern width W(Ns) of the source region 5 is 1 micrometer or less.

Next, the mask opening for forming the base contact regions 6 and the source regions 5 is described.

Figure 8A:
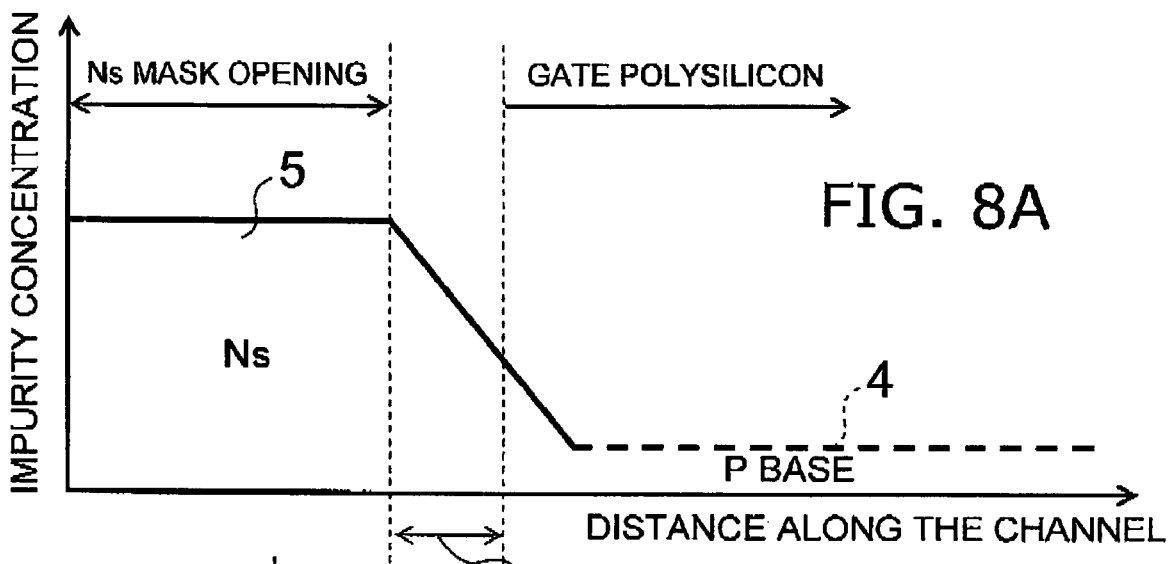
FIGS. 8A and 8B are a diagram for illustrating the mask opening and the impurity concentration distribution.

FIGS. 8A and 8A are diagrams for illustrating the mask opening and the impurity concentration distribution. More specifically, FIG. 8A is a graph showing the impurity concentration distribution in the $n^+$-type source region 5, and FIG. 8B is a graph showing the impurity concentration distribution in the $p^+$-type base contact region 6. In these graphs, the horizontal axis represents the distance along the channel (horizontal direction in FIG. 1B). These graphs also show the position of the gate electrode 15 and the mask opening.

Figure 8B:
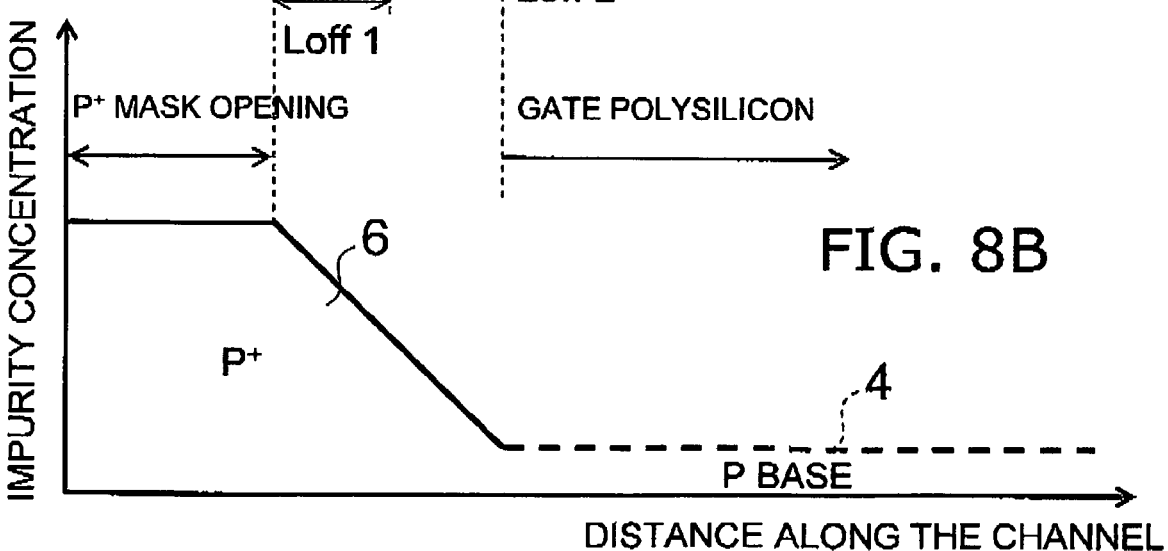

As shown in FIGS. 8A and 8B, in this embodiment, the $p^+$-type base contact region 6 (the peak zone of the p-type impurity concentration) can be set back by the offset Loff1 from the drain portion, and the $n^+$-type source region 5 (the peak zone of the n-type impurity concentration) can be set back by the offset Loff2 from the edge of the gate electrode 15.

More specifically, the junction between the source regions 5 and the base region 4 are closer to the drain D side than the junction between the base contact regions 6 and the base region 4. In the specification of this application, the junction between the base contact regions 6 and the base region 4 is defined as the opening edge of the mask used for selectively introducing p-type impurities into the base contact region 6, or as the portion in which the p-type impurity concentration of the base contact region 6 begins to decrease toward the base region 4. Because the opening edge of the mask used for selectively introducing n-type impurities into the source region 4 is closer to the drain portion D side than the opening edge of the mask used for selectively introducing p-type impurities into the base contact region 6, the junction between the source regions 5 and the base region 4 are closer to the drain D side than the junction between the base contact regions 6 and the base region 4.

In this case, the offset Loff($p^+$) of the $p^+$-type base contact region 6 and the offset Loff(Ns) of the $n^+$-type source region 5 from the edge of the gate electrode 15 can be specified by adjusting the relation of the gate mask pattern edge to the gate-side opening edge of the mask used in the process of selectively introducing p-type impurities into the base contact region 6 and to the gate-side opening edge of the mask used in the process of selectively introducing n-type impurities into the source region 5, respectively.

That is, the opening of the mask used in introducing impurities for forming these regions 6 and 5 is preferably displaced as shown. This allows for preventing the parasite bipolar effect in the source portion S and further improving the switching withstand value while decreasing on-resistance.

Next, the offset of the $n^+$-type drain region 7 is described.

Figure 9:
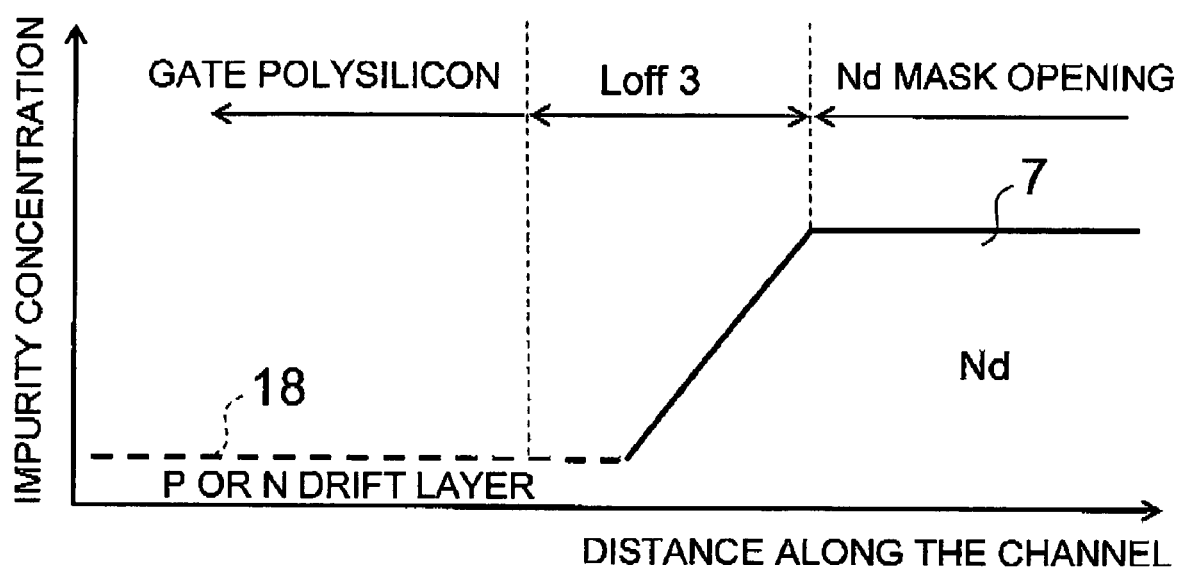
FIG. 9 is a diagram for illustrating the offset of the $n^+$-type drain region 7.

FIG. 9 is a diagram for illustrating the offset of the $n^+$-type drain region 7. The graph in this figure shows the impurity concentration distribution in the $n^+$-type drain region 7, where the horizontal axis represents the distance along the channel (horizontal direction in FIG. 1B). This graph also shows the position of the gate electrode 15 and the mask opening.

As shown in FIG. 9, in this embodiment, the n$^+$-type drain region 7 can be set back by the offset Loff3 from the edge of the gate electrode 15. That is, the opening of the mask used in the process of introducing impurities for forming the drain region 7 is preferably located away from the gate edge as shown in FIG. 9.

Figure 10A:
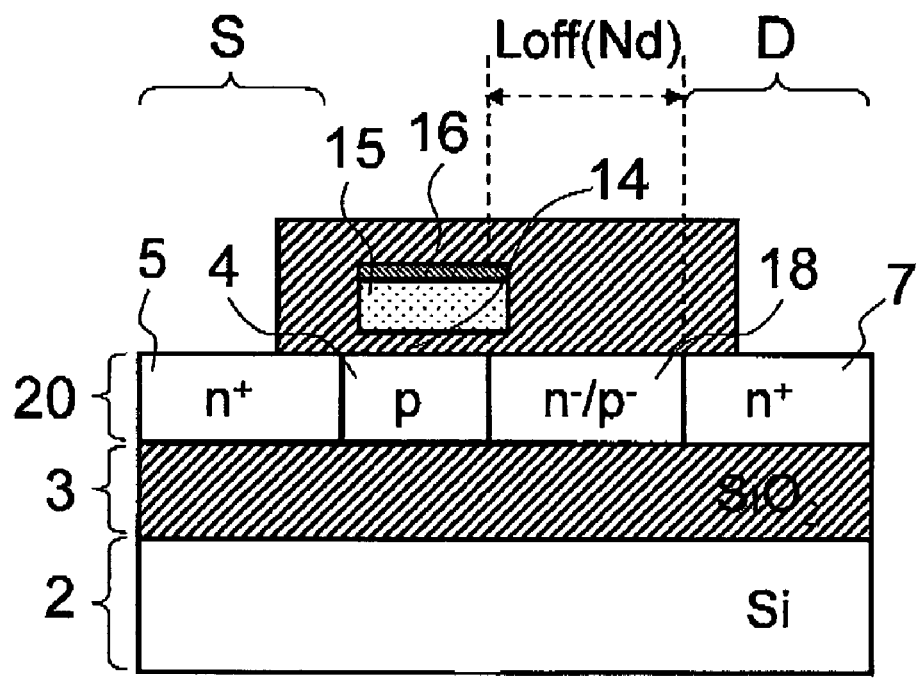
FIG. 10A is a cross section of a field effect transistor according to a modification of the first embodiment of the invention.
Figure 10B:
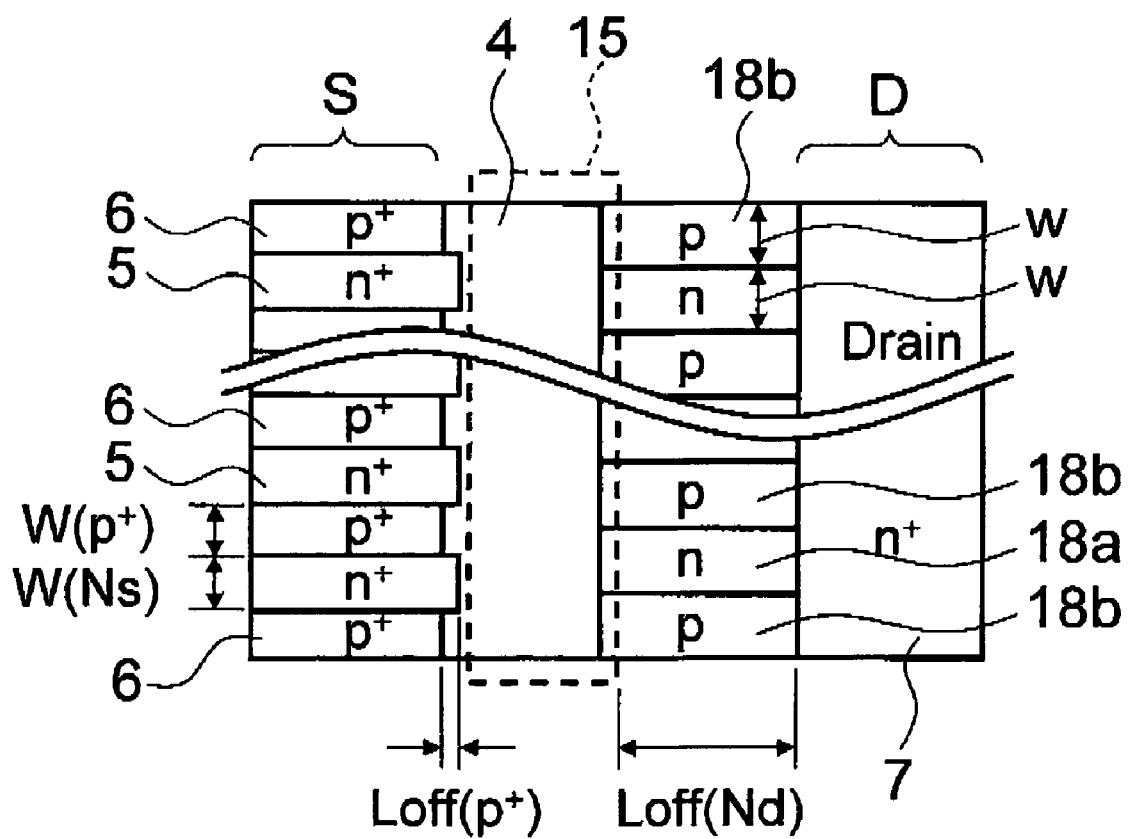
FIG. 10B is a diagram illustrating the planar arrangement of the semiconductor portion of the field effect transistor.

FIGS. 10A and 10B are diagrams illustrating a field effect transistor according to a modification of this embodiment. More specifically, FIG. 10A is a cross section of the field effect transistor, and FIG. 10B is a diagram illustrating the planar arrangement of the semiconductor portion of the field effect transistor. With regard to this figure, elements similar to those described above with reference to FIGS. 1 to 9 are marked with the same reference numerals and explanation of such portions is omitted.

In this modification, the drift region 18 has n-type stripe regions 18a and p-type stripe regions 18b alternately between the p-type base region 4 and the n$^+$-type drain region 7. Each of the n-type stripe regions 18a and p-type stripe regions 18b is shaped as a stripe extending along the channel. The width W of the n-type stripe region 18a and p-type stripe region 18b (the width perpendicular to the channel) is set to be smaller than the width of the depletion layer that exist at the p-n junction in thermal equilibrium. Thus, when the transistor is in the off-state (the drain voltage is zero volt), the drift region 18 is depleted due to the diffusion potential, and the radio frequencies can be definitely blocked by reducing the output capacitance. Due to this effect of depleting the drift region 18, the source-drain capacitance and the drain-gate capacitance can be significantly reduced when the transistor is in the off-state.

In order to deplete the drift region 18 in thermal equilibrium, the width W of the n-type stripe region 18a and the p-type stripe region 18b preferably satisfies the following condition:

$$W < (2 \in_s \cdot Vbi(Np+Nn)/(qNpNn))^{0.5}$$

where $\in_s$ is the specific dielectric constant of silicon, Vbi is the diffusion potential at the p-n junction of the stripe regions 18a and 18b.

When a positive potential is applied to the gate electrode 15, the depleted drift region 18 is filled with electrons produced by the gate voltage and becomes less resistive. As a result, the transistor is turned into the low on-resistance state.

Figure 11A:
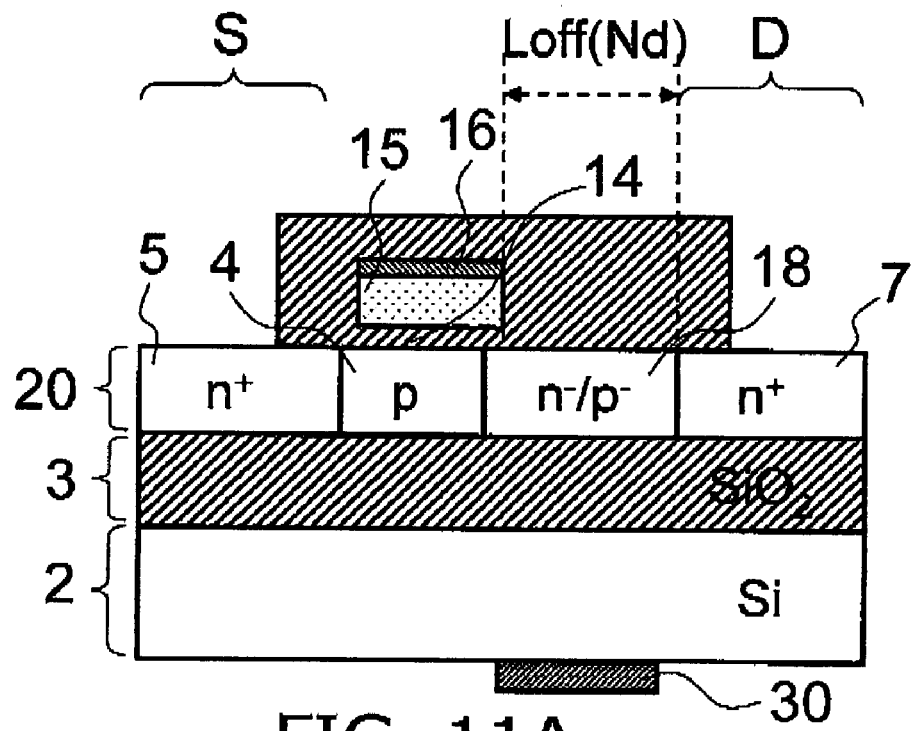
FIG. 11A is a cross section of a field effect transistor according to a second modification of the first embodiment of the invention.
Figure 11B:
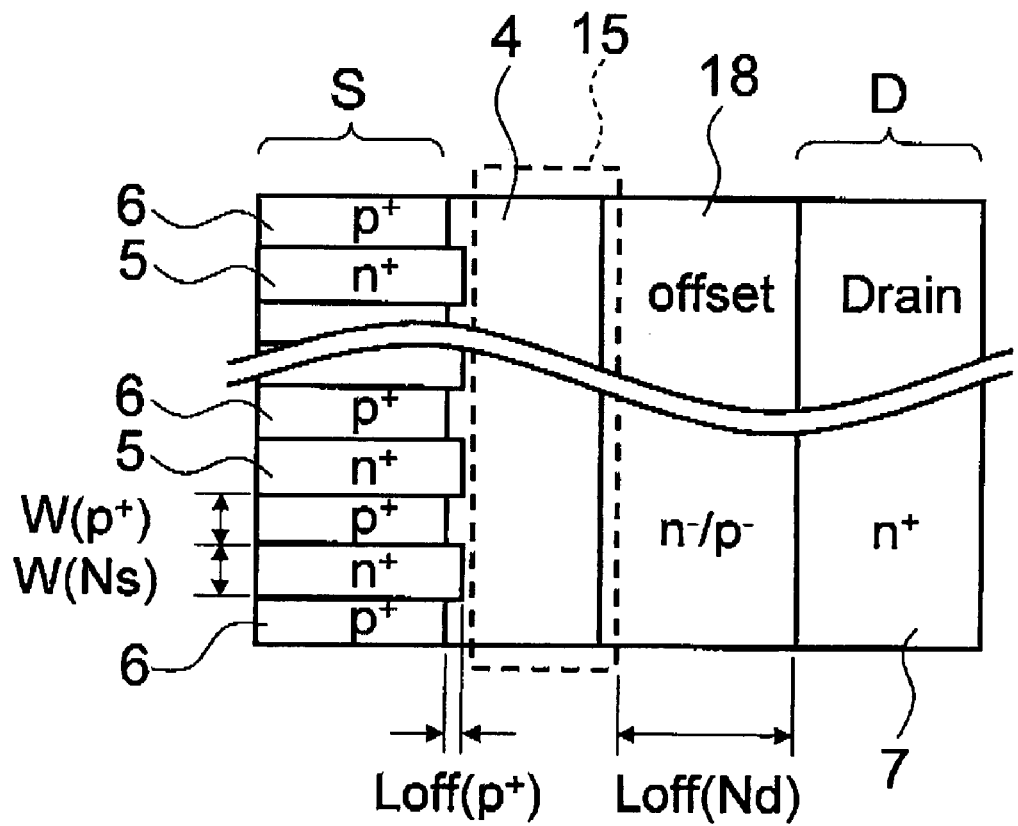
FIG. 11B is a diagram illustrating the planar arrangement of the semiconductor portion of the field effect transistor.

FIGS. 11A and 11B are diagrams illustrating a field effect transistor according to a second modification of this embodiment. More specifically, FIG. 11A is a cross section of the field effect transistor, and FIG. 11B is a diagram illustrating the planar arrangement of the semiconductor portion of the field effect transistor. With regard to this figure, elements similar to those described above with reference to FIGS. 1 to 10 are marked with the same reference numerals and explanation of such portions is omitted.

In this embodiment, a second gate electrode 30 is provided on the back side of the supporting substrate 2. As described above with reference to FIGS. 1 and 10, when the transistor is turned on, a voltage is applied to the gate electrode 15 to produce a channel in the p-type base region 4. However, the electric field may not be applied sufficiently to the drift region 18. To overcome this problem, in this modification, a second gate electrode 30 is provided on the rear side of the supporting substrate 2 to apply an electric field to the drift region 18 via the buried insulating layer 3. As a result, a channel can be stably produced in the drift region 18 to achieve a low on-resistance.

Because the second gate electrode 30 is provided via the buried insulating layer 3, which is thicker than the gate insulating film 14, a low on-resistance can be achieved while preventing the decrease of the device withstand voltage and the increase of the gate-drain capacitance Cdg.

While FIGS. 11A and 11B illustrate the drift region 18 having p-type or n-type semiconductor with low concentration, the invention is not limited thereto. The same function and effect can be achieved by the configuration having a plurality of stripe regions as illustrated in FIGS. 10A and 10B.

The second gate electrode 30 may be provided on the back of the buried insulating layer 3 without the supporting substrate 2.

Next, a photorelay based on the field effect transistor of this embodiment is described.

Figure 12:
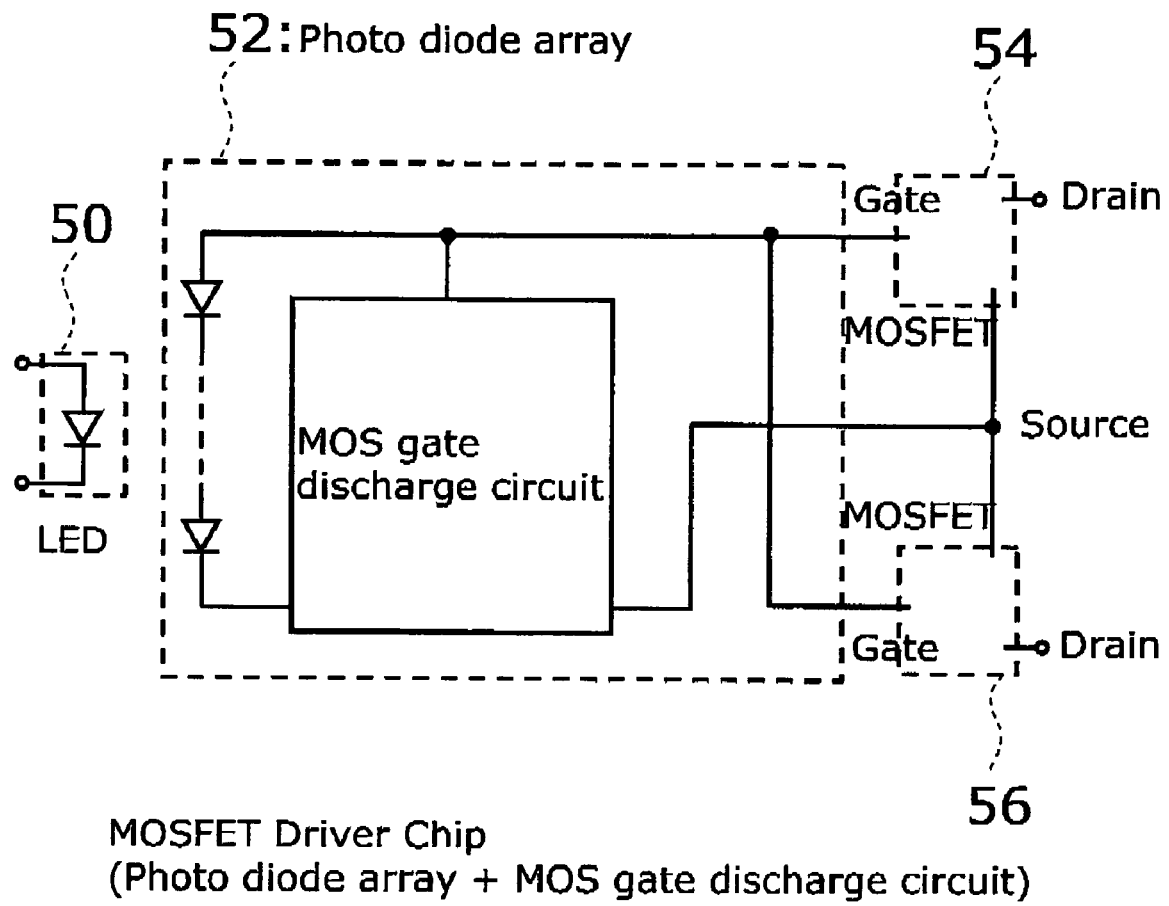
FIG. 12 is a diagram showing a photorelay circuit of the embodiment of the invention.

FIG. 12 is a diagram showing a photorelay circuit of this embodiment.

More specifically, this photorelay comprises a GaAs infrared light emitting diode 50, PDA (Photo Diode Array) 52, and MOSFET switches 54 and 56, and can be housed in a 4-pin package (SOP). The chip size is about 0.8×0.8 millimeter. Two MOSFET switches 54 and 56 are connected in one chip to form an AC switch. The field effect transistor described above with reference to FIGS. 1 to 11 can be used as these MOSFET switches 54 and 56.

For example, the SOI layer 20 used in the MOSFET switches 54 and 56 has a thickness of about 0.1 micrometer, the buried insulating layer 3 has a thickness of about 3 micrometers, the gate insulating film 14 has a thickness of about 0.14 micrometer, and the offset Loff(Nd) of the n$^+$-type drain region 7 from the edge of the gate electrode 15 is about 0.6 micrometer.

According to this embodiment, MOSFETs 54 and 56 having a low on-resistance and a high switching withstand value can be used to achieve an extremely high isolation characteristic of 10 decibels for a signal frequency of 2.5 gigahertz. At the same time, the insertion loss of this photorelay is as low as 1 decibel for a signal frequency of 2 gigahertz, hence achieving a high withstand voltage and a low loss simultaneously.

In the following, other embodiments of the invention are described. Elements similar to those described above are marked with the same reference numerals and not described in detail.

SECOND EMBODIMENT

Figure 14A:
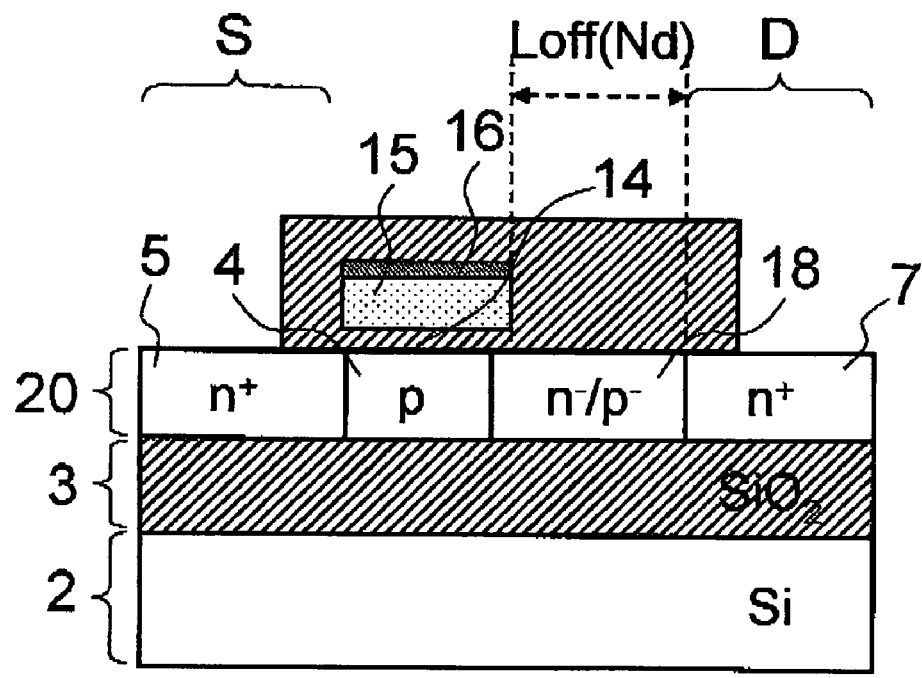
FIG. 14A is a cross section of a field effect transistor according to the second embodiment of the invention.
Figure 14B:
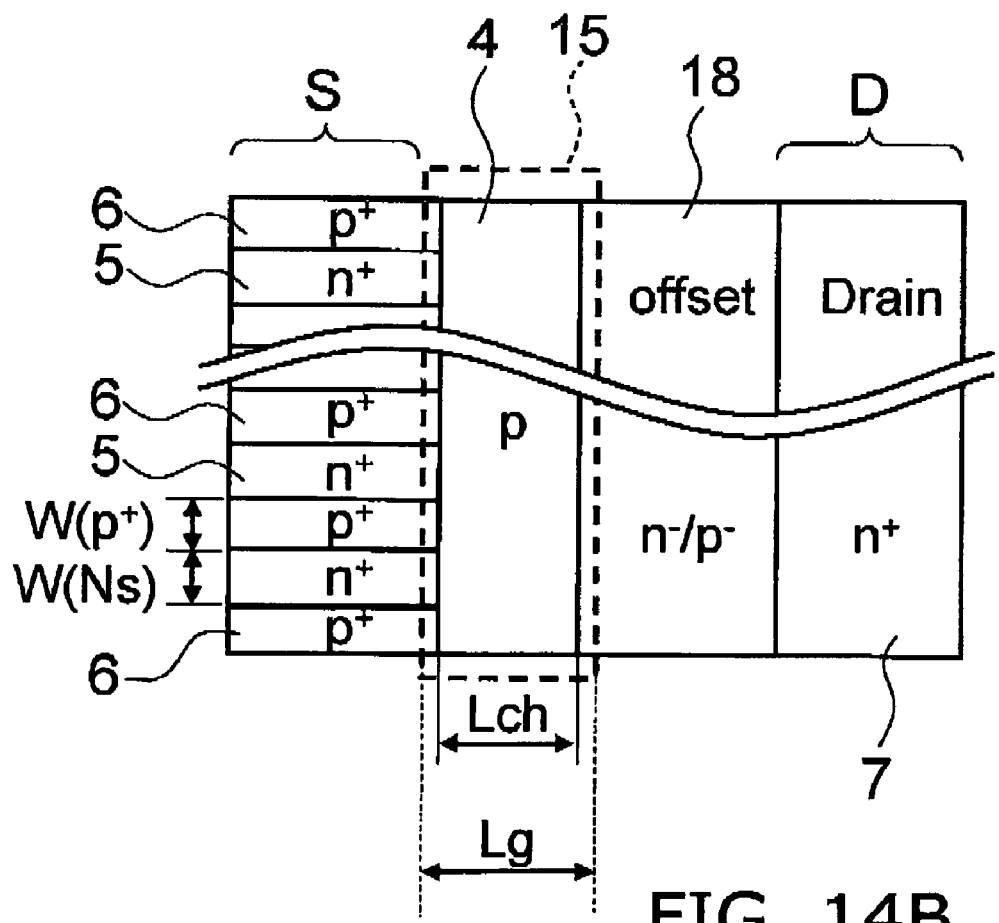
FIG. 14B is a diagram illustrating the planar arrangement of the semiconductor portion of the field effect transistor.

FIGS. 14A and 14B are diagrams illustrating a field effect transistor according to a second embodiment of the invention. More specifically, FIG. 14A is a cross section of the field effect transistor, and FIG. 14B is a diagram illustrating the planar arrangement of the semiconductor portion of the field effect transistor.

The field effect transistor of this embodiment also has an SOI (Silicon On Insulator) structure. More specifically, the SOI layer 20 is provided on a supporting substrate 2 made of silicon via a buried insulating layer 3 made of silicon oxide. The SOI layer 20 has a source portion S, a drain portion D, and a p-type base region 4 and a drift region 18 provided therebetween.

The source portion S is configured so that n$^+$-type source regions 5 and p$^+$-type base contact regions 6 are alternated in the direction perpendicular to the channel.

The n$^+$-type source regions 5 and p$^+$-type base contact regions 6 are both connected to a source electrode. The $p^+$-type base contact regions 6 serve to fix the potential of the p-type base region 4 to the source potential.

The drain portion D comprises an $n^+$-type drain region 7. The p-type base region 4 is a semiconductor region where a channel is produced. The drift region 18 is made of $p^-$-type or $n^-$-type silicon having a higher resistance than the p-type base region 4 and serves to increase the withstand voltage of the transistor.

On the p-type base region 4 is provided a gate insulating film 14, on which a gate electrode 15 is provided. The gate electrode 15 extends into a part of the $n^+$-type source regions 5 (the vicinity of the junction between the p-type base region 4 and the $n^+$-type source regions 5) and a part of the drift region 18 (the vicinity of the junction between the p-type base region 4 and the drift region 18). On the gate electrode 15, a conducting layer 16 made of tungsten suicide (WSi) or the like may be provided in order to decrease the connection resistance with a gate interconnect, not shown.

In this embodiment as well, when a prescribed voltage is applied to the gate electrode 15, a channel is produced in the p-type base region 4 and the transistor is turned on, allowing a current to flow between the source regions 5 and the drain region 7. The $p^+$-type base contact regions 6 serve to fix the potential of the p-type base region 4 to the source potential in the off-state and prevent the parasite bipolar effect in the off-state and at the switching time, thereby the withstand voltage of the transistor may be increased.

Furthermore, the inventors have found the following. When the device is designed so that the ratio of the channel length Lch to the width W(Ns) of the source region 5 is 1.5 or more, that is, Lch/W(Ns)≧1.5, the hole current that occurs at the switching time or in the avalanche region of the device can be efficiently ejected to the source electrode via the $p^+$-type base contact regions 6. As a result, the parasite bipolar effect can be prevented to improve the avalanche withstand value and switching withstand value.

The width W(Ns) of the source region 5 is a width measured in the direction of alternate alignment of the source regions 5 and the base contact regions 6 (perpendicular to the direction connecting the source portion S to the drain portion D). The channel length Lch is the length of the base region 4 below the gate electrode 15, measured parallel to the direction connecting the source portion S to the drain portion D. However, because the actual channel length Lch fluctuates with the manufacturing process, the gate length Lg given as a nominal value (the length of the gate electrode 15 measured parallel to the direction connecting the source portion S to the drain portion D) may be used as the channel length Lch.

Figure 15:
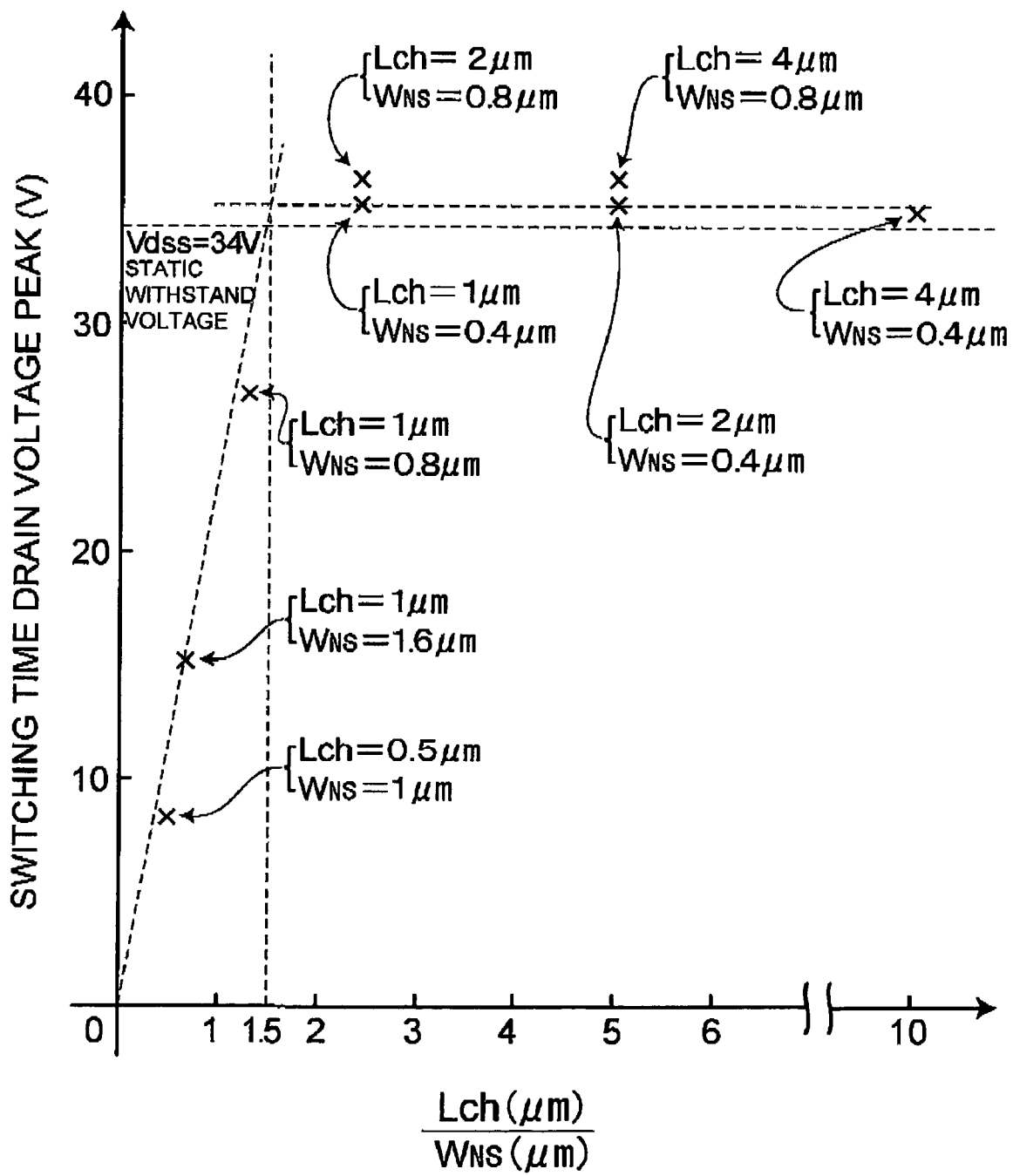
FIG. 15 shows a calculation result of simulating the drain voltage peak at the switching time for the field effect transistor according to the second embodiment of the invention where Lch/W(Ns) is varied.

FIG. 15 shows a calculation result of simulating the drain voltage peak at the switching time for the transistor designed to have the structure shown in FIGS. 14A and 14B and the device withstand voltage (static withstand voltage) Vdss=34 (V) where Lch/W(Ns) is varied. The horizontal axis represents Lch/W(Ns), and the vertical axis represents the switching time drain voltage peak (V).

The switching time drain voltage peak is simulated for the following cases: Lch is 0.5 micrometer (μm) and W(Ns) is 1 micrometers (μm) (Lch/W(Ns)=0.5); Lch is 1 micrometer (μm) and W(Ns) is 1.6 micrometers (μm) (Lch/W(Ns) =0.625); Lch is 1 micrometer (μm) and W(Ns) is 0.8 micrometer (μm) (Lch/W(Ns)=1.25); Lch is 1 micrometer (μm) and W(Ns) is 0.4 micrometer (μm) (Lch/W(Ns)=2.5); Lch is 2 micrometers (μm) and W(Ns) is 0.8 micrometer (μm) (Lch/W(Ns)=2.5); Lch is 2 micrometers (μm) and W(Ns) is 0.4 micrometer (μm) (Lch/W(Ns)=5); Lch is 4 micrometers (μm) and W(Ns) is 0.8 micrometer (μm) (Lch/W(Ns)=5); and Lch is 4 micrometers (μm) and W(Ns) is 0.4 micrometer (μm) (Lch/W(Ns)=10).

The width $W(p^+)$ of the base contact region 6 measured in the direction of alternate alignment of the source regions 5 and the base contact regions 6 (perpendicular to the direction connecting the source portion S to the drain portion D) is fixed to 1.6 micrometers (μm).

In FIG. 15, the approximate line of the data lower than the device withstand voltage Vdss (=34 V) crosses the approximate line of the data higher than the device withstand voltage Vdss (=34 V) at Lch/W(Ns)=1.5. More specifically, when Lch/W(Ns) is less than 1.5, a switching withstand value is less than the device withstand voltage Vdss (=34 V). When Lch/W(Ns) is 1.5 or more, the switching withstand value of not less than the device withstand voltage Vdss (=34 V) is achieved.

The second embodiment can be combined with the first embodiment described earlier. That is, the $p^+$-type base contact regions 6 can be offset away from the drain portion D to recede relative to the $n^+$-type source regions 5. This allows for ensuring an effective channel area in the on-state, thereby preventing the increase of on-resistance and achieving a high withstand voltage due to Lch/W(Ns)≧1.5.

The switching withstand value can be further improved by setting the width W(Ns) of the source region 5 to 1 micrometer or less as described above with reference to FIG. 7 while satisfying Lch/W(Ns)≧1.5.

The drift region 18 may have n-type stripe regions 18a and p-type stripe regions 18b alternately as shown in FIGS. 10A and 10B.

The transistor according to the second embodiment can also be used as the MOSFET switches 54 and 56 in the photorelay described above with reference to FIG. 12, like the first embodiment. The gate driving voltage of the MOSFET switches 54 and 56 is generally equal to or higher than the drain-source withstand voltage of the MOSFET switches 54 and 56.

The output capacitance can be reduced by thinning the SOI layer (to 1 micrometer or less, for example). The thin-film SOI MOSFET like this has been commercially available as a low withstand voltage CMOS for signal processing in LSI logic circuits. In such technical fields, the device withstand voltage may be relatively low, and the decrease of the switching withstand value has caused no problem. However, when MOSFETs having a thin-film SOI structure are used in relays and power devices, which require a relatively high withstand voltage and a large area (large gate width Wg), the decrease of the switching withstand value and the avalanche withstand value causes a serious problem and prevents commercialization.

In this respect, the transistor according to this embodiment achieves a high withstand voltage while reducing the output capacitance by thinning the SOI layer. This enables MOSFETs having a thin-film SOI structure to be applied to semiconductor relays and power device products.

Third Embodiment

Figure 16:
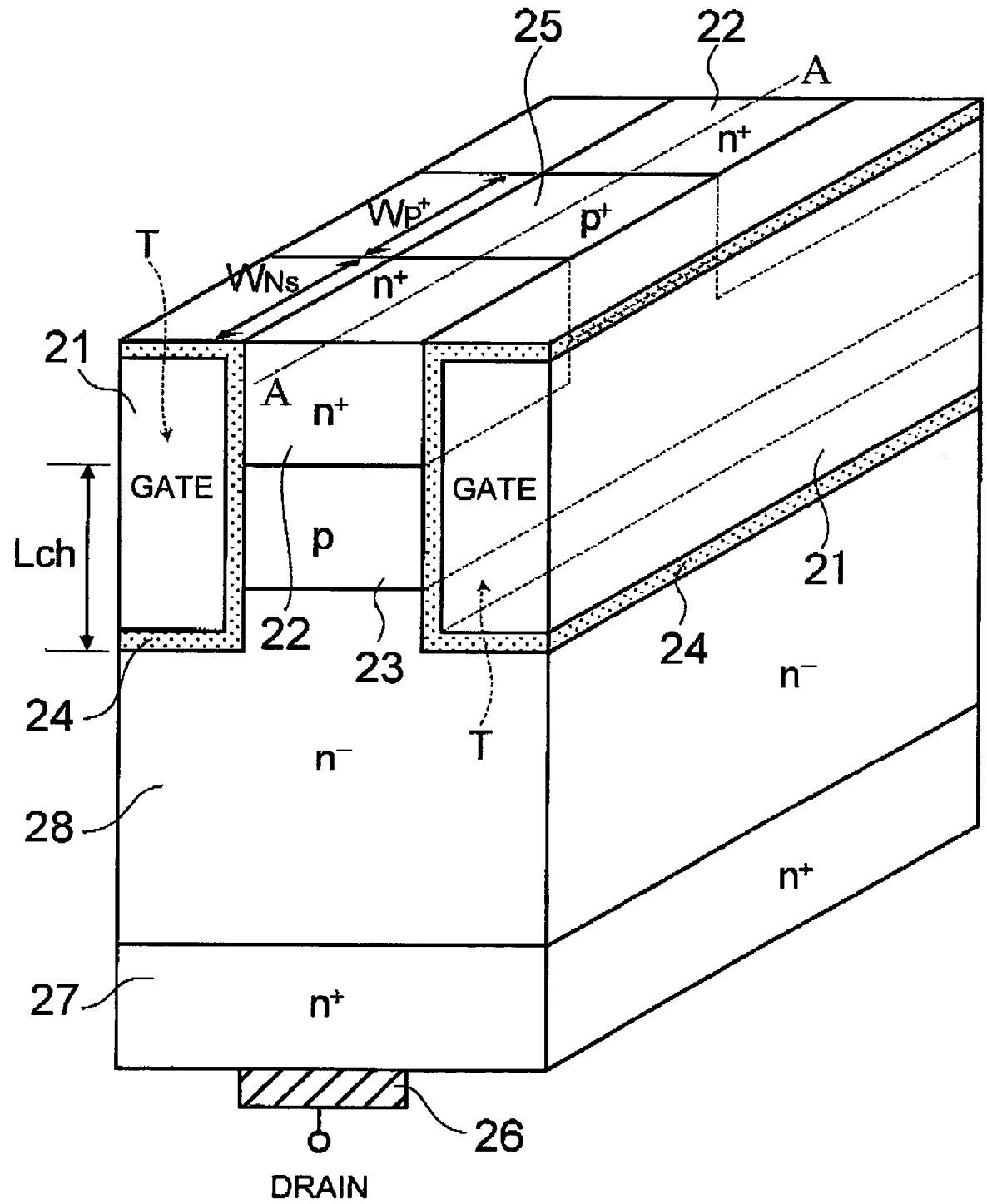
FIG. 16 is a perspective view illustrating the planar and cross-sectional structure of the relevant part of a transistor according to a third embodiment of the invention.
Figure 17:
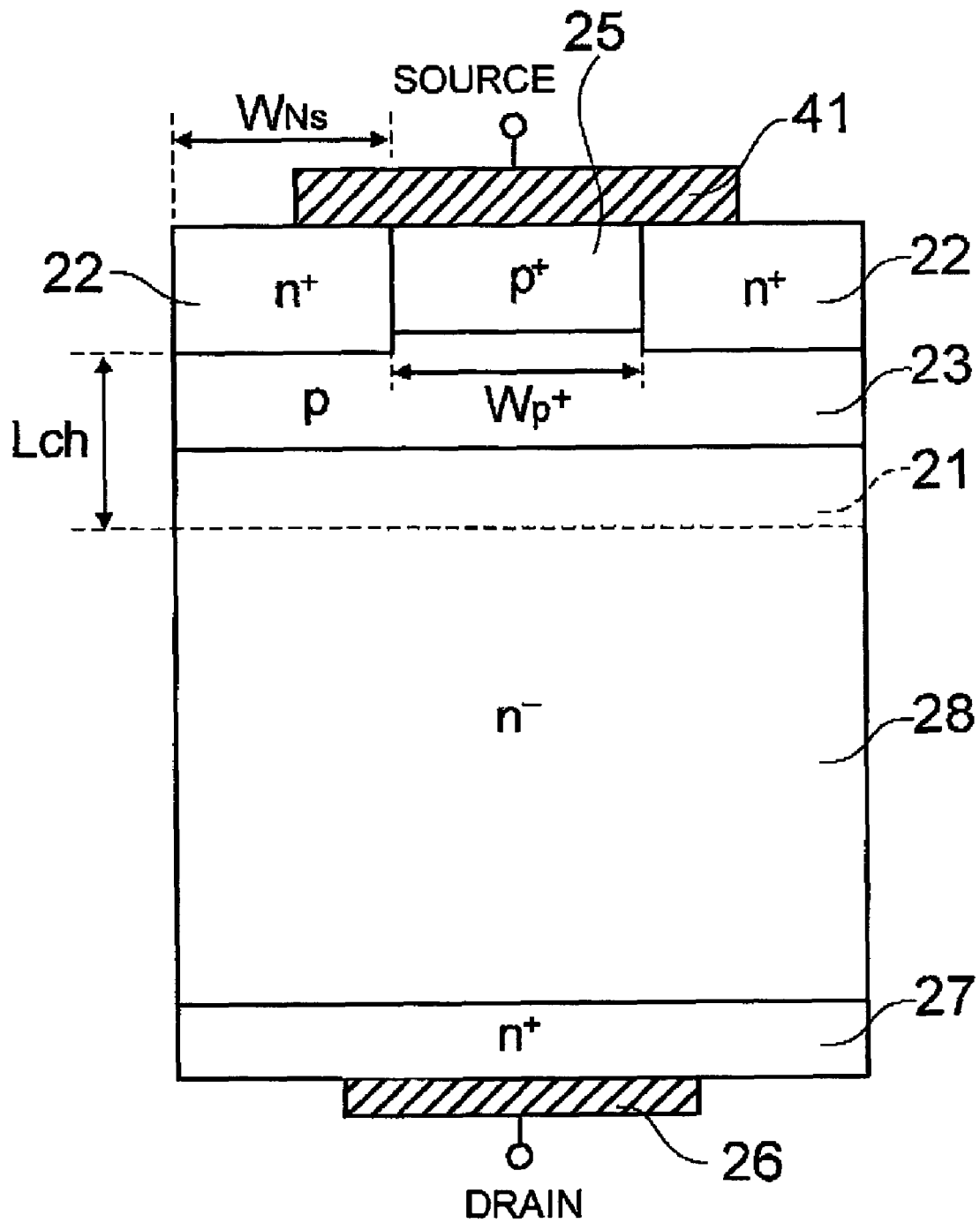
FIG. 17 is a section view taken along A-A line in FIG. 16.

FIG. 16 is a perspective view illustrating the planar and cross-sectional structure of the relevant part of a transistor according to a third embodiment of the invention. FIG. 17 is a A-A line section in FIG. 16. The transistor according to this embodiment is a MOSFET having the so-called trench gate structure.

A drift layer 28 made of $n^-$-type silicon is provided on a major surface of a drain layer 27 made of $n^+$-type silicon.

Trenches T are formed in the surface portion of the drift layer 28. The inside of the trench T is filled with a gate electrode 21 made of polysilicon, for example, via a gate insulating film 24. A drain electrode 26 is provided on the side opposite to the major surface of the drain layer 27.

On the drift layer 28 between the adjacent trenches T is provided a base region 23 made of p-type silicon, on which a source portion (first main semiconductor portion) is provided. The source portion has a structure in which an n$^+$-type source region (first main semiconductor region) 22 and a p$^+$-type base contact region 25 are alternated in the direction perpendicular to the channel (perpendicular to the depth of the trench T). The source region 22 and the base contact region 25 are both connected to a source electrode not shown in FIG. 16. The base contact region 25 serves to fix the potential of the base region 23 to the source potential.

When a prescribed voltage is applied to the gate electrode 21, a channel is produced in the base region 23 and the transistor is turned on, allowing a current to flow between the source region 22 and the drain layer 27. The base contact region 25 serves to fix the potential of the base region 23 to the source potential in the off-state and prevent the parasitic bipolar effect in the off-state and at the switching time, thereby increasing the withstand voltage of the transistor.

Furthermore, in this embodiment as well, like the second embodiment, the device is designed so that the ratio of the channel length Lch (measured parallel to the direction connecting the source region 22 to the drain layer 27) versus the width W(Ns) of the source region 22 (measured in the direction of alignment of the source region 22 and the base contact region 25) is 1.5 or more, that is, Lch/W(Ns)$\geq$1.5. Thus the hole current that occurs at the switching time or in the avalanche region of the device can be efficiently ejected to the source electrode via the p$^+$-type base contact region 25. As a result, the parasitic bipolar effect can be prevented to improve the avalanche withstand value and switching withstand value.

When a prescribed voltage is applied to the gate electrode 21, an inversion layer is produced in a portion in the base region 23 that is opposed to the gate electrode 21 and a charge storage layer is produced in a portion in the drift layer 28 that is opposed to the gate electrode 21. A channel is produced by the inversion layer and the charge storage layer. Accordingly, the channel length Lch in this embodiment is defined as the length of the portion in the base region 23 that is opposed to the gate electrode 21 and the length of the portion in the drift layer 28 that is opposed to the gate electrode 21.

FOURTH EMBODIMENT

Figure 18:
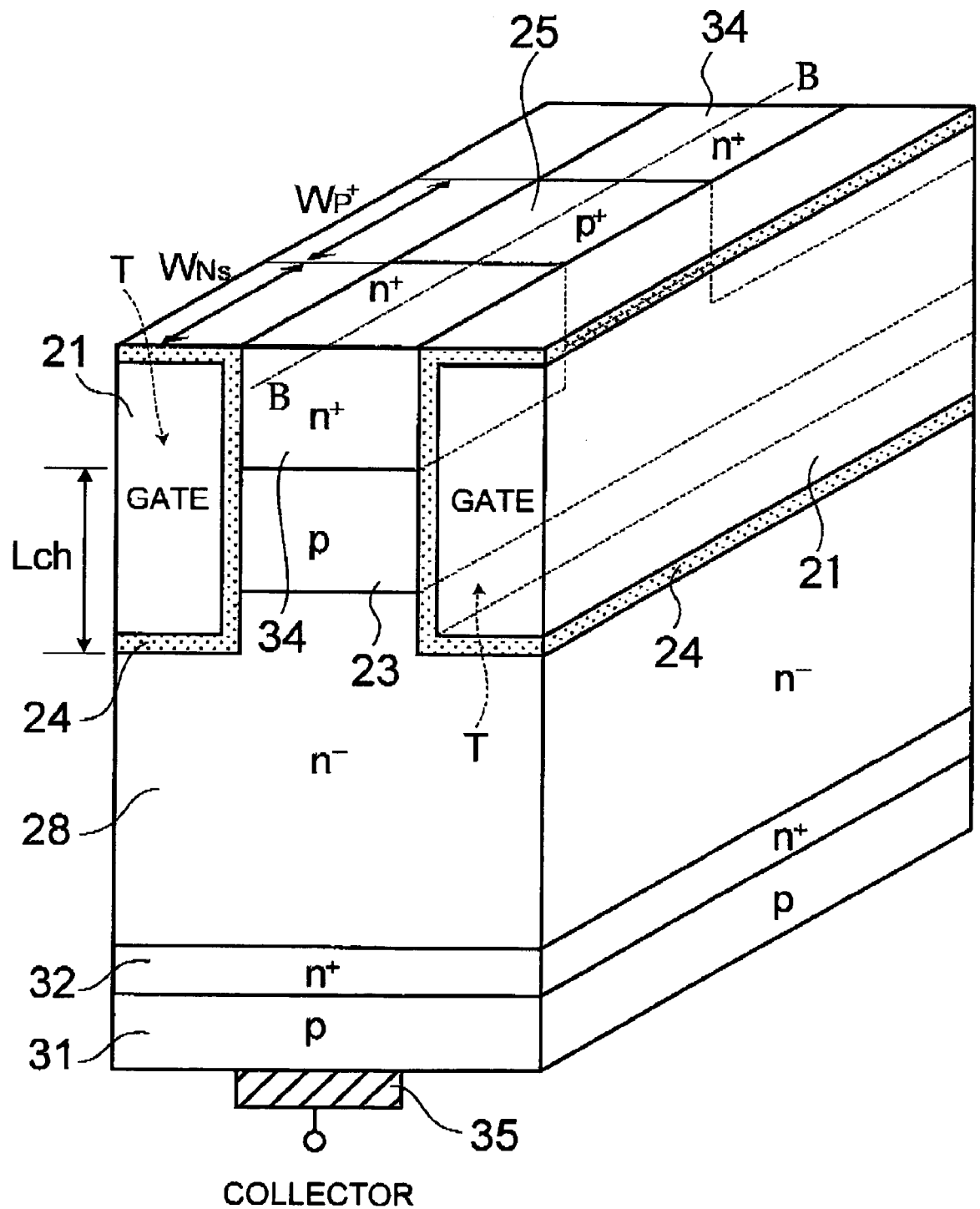
FIG. 18 is a perspective view illustrating the planar and cross-sectional structure of the relevant part of a transistor according to a fourth embodiment of the invention.
Figure 19:
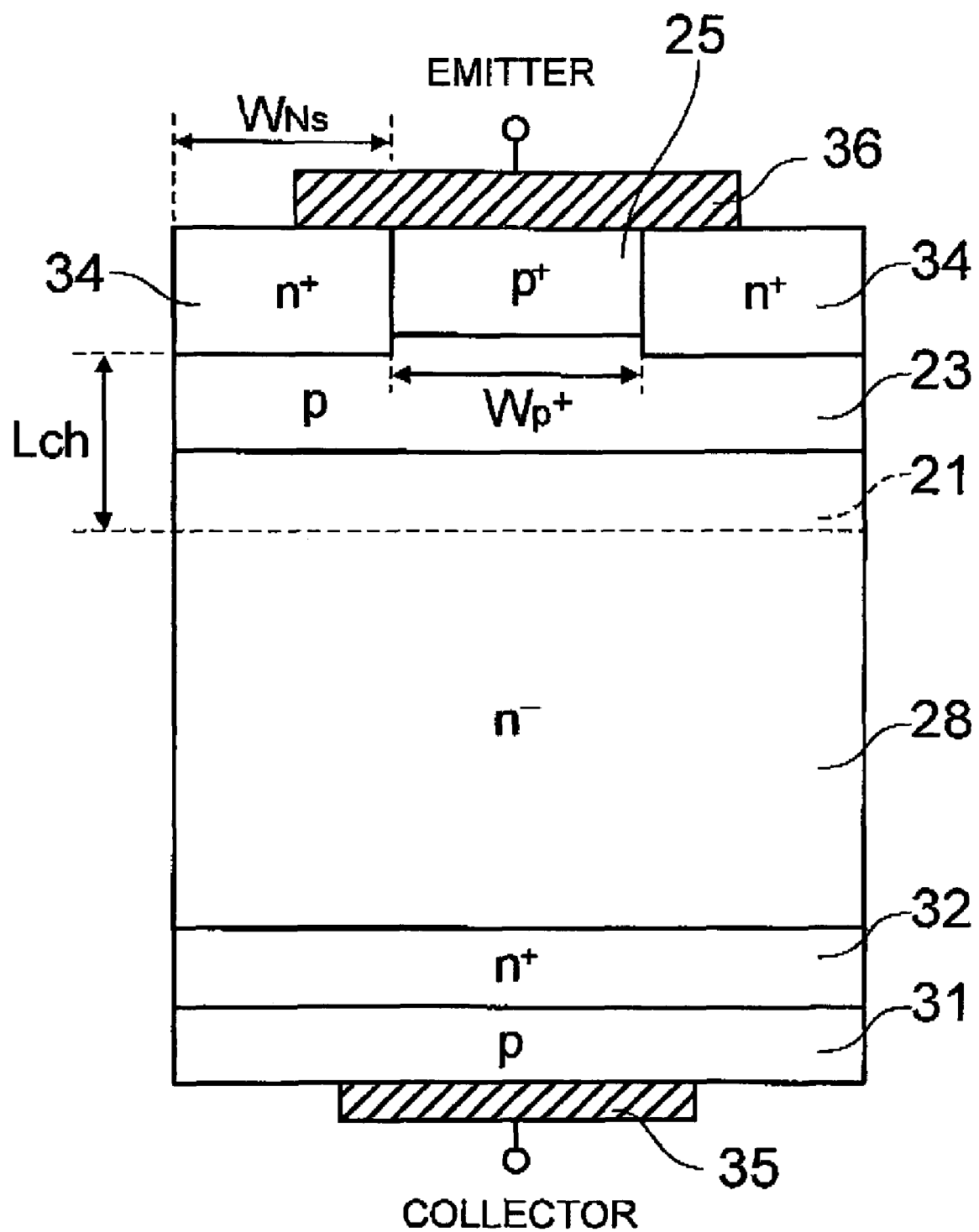
FIG. 19 is a section view taken along B-B line in FIG. 18.

FIG. 18 is a perspective view illustrating the planar and cross-sectional structure of the relevant part of a transistor according to a fourth embodiment of the invention. FIG. 19 is a B-B line section in FIG. 18. The transistor according to this embodiment is an IGBT (Insulated Gate Bipolar Transistor) having the so-called trench gate structure.

An n$^+$-type silicon layer 32 and a drift layer 28 made of n$^-$-type silicon are provided in this order on a major surface of a collector layer 31 made of p-type silicon. Trenches T are formed in the surface portion of the drift layer 28. The inside of the trench T is filled with a gate electrode 21 made of polysilicon, for example, via a gate insulating film 24. A collector electrode 35 is provided on the side opposite to the major surface of the collector layer 31.

On the drift layer 28 between the adjacent trenches T is provided a base region 23 made of p-type silicon, on which an emitter portion (first main semiconductor portion) is provided. The emitter portion has a structure in which an n$^+$-type emitter region (first main semiconductor region) 34 and a p$^+$-type base contact region 25 are alternated in the direction perpendicular to the channel (perpendicular to the depth of the trench T). The emitter region 34 and the base contact region 25 are both connected to an emitter electrode. The base contact region 25 serves to fix the potential of the base region 23 to the emitter potential.

When a prescribed voltage is applied to the gate electrode 21, a channel is produced in the base region 23 and the transistor is turned on, allowing a current to flow between the emitter region 34 and the collector layer 31. The base contact region 25 serves to fix the potential of the base region 23 to the emitter potential in the off-state and prevent the parasitic bipolar effect in the off-state and at the switching time, thereby increasing the withstand voltage of the transistor.

Furthermore, in this embodiment, the device is designed so that the ratio of the channel length Lch (measured parallel to the direction connecting the emitter region 34 to the collector layer 31) to the width W(Ns) of the emitter region 34 (measured in the direction of alignment of the emitter region 34 and the base contact region 25) is 1.5 or more, that is, Lch/W(Ns)$\geq$1.5. Thus the hole current that occurs at the switching time or in the avalanche region of the device can be efficiently ejected to the emitter electrode via the p$^+$-type base contact region 25. As a result, the parasitic bipolar effect can be prevented to improve the avalanche withstand value and switching withstand value.

The channel length Lch is defined as the length of the portion in the base region 23 that is opposed to the gate electrode 21 and the length of the portion in the drift layer 28 that is opposed to the gate electrode 21, like the third embodiment.

The transistor according to the third and fourth embodiments can also be used as the MOSFET switches 54 and 56 in the photorelay described above with reference to FIG. 12.

FIFTH EMBODIMENT

Figure 20:
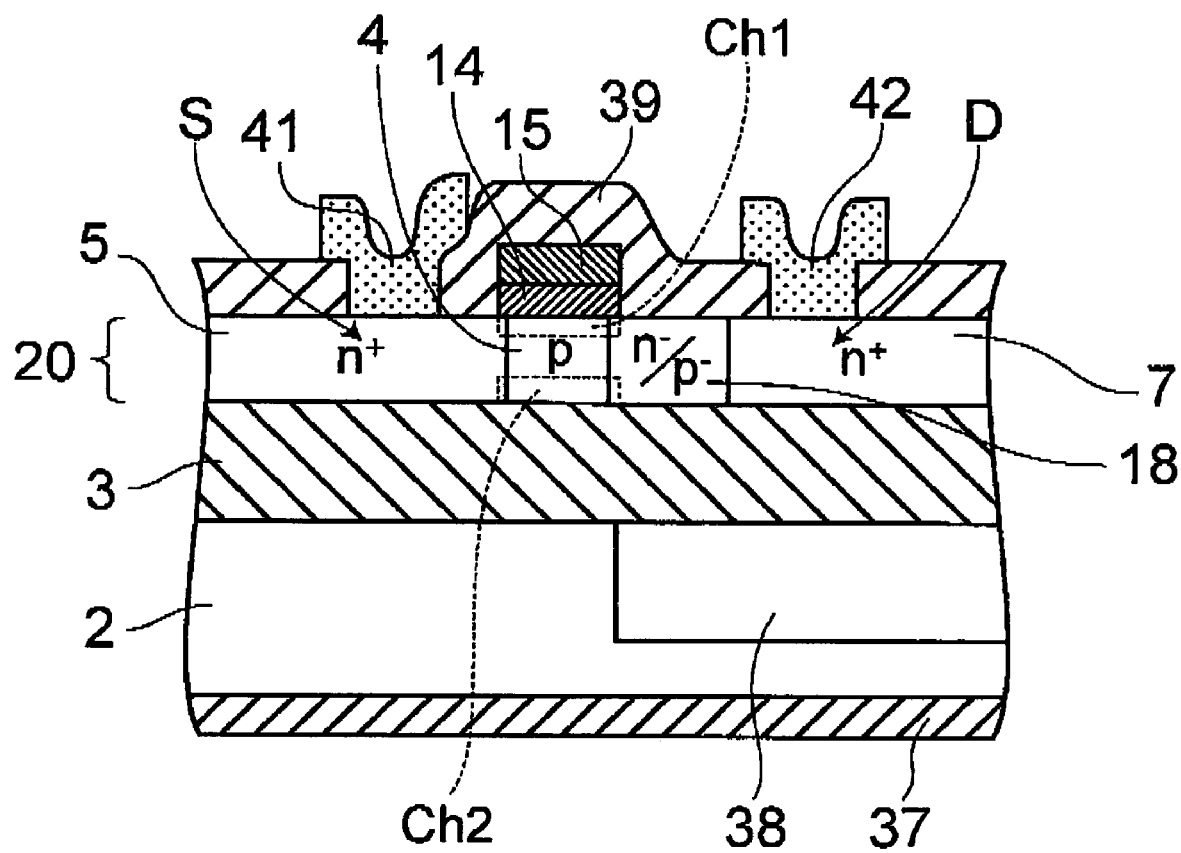
FIG. 20 is a view illustrating a cross-sectional structure of a transistor according to a fifth embodiment of the invention.

FIG. 20 is a view illustrating the cross-sectional structure of a transistor according to a fifth embodiment of the invention.

The transistor according to this embodiment also has an SOI (Silicon On Insulator) structure like the first and second embodiments. More specifically, an SOI layer 20 is provided on a major surface of a silicon substrate 2 via a buried insulating layer 3 made of silicon oxide. This SOI structure is obtained by, for example, forming the buried insulating layer 3 on the major surface of the silicon substrate 2 by high temperature oxidation and affixing the SOI layer 20 onto a first major surface of the buried insulating layer 3. The conductivity type of the silicon substrate 2 is n-type, for example, although it may be p-type.

The SOI layer 20 has a source portion S, a drain portion D, and a p-type base region 4 and a drift region 18 provided therebetween. The source portion S, drain portion D, base region 4, and drift region 18 are provided on the first major surface of the buried insulating layer 3.

In this embodiment as well, like the second embodiment, as shown in FIG. 14B, the source portion S is configured so that n$^+$-type source regions 5 and p$^+$-type base contact regions 6 are alternated in the direction perpendicular to the channel. The drain portion D comprises an n$^+$-type drain region 7. The p$^+$-type base contact regions 6 serve to fix the potential of the p-type base region 4 to the source potential in the off-state and prevent the parasitic bipolar effect in the off-state and at the switching time, thereby increasing the withstand voltage of the transistor.

On the base region 4 is provided a gate insulating film 14, on which a first gate electrode 15 is provided. The gate insulating film 14 and gate electrode 15 extend into part of the n$^+$-type source regions 5 (the vicinity of the junction between the p-type base region 4 and the n$^+$-type source regions 5) and part of the drift region 18 (the vicinity of the junction between the p-type base region 4 and the drift region 18). The gate insulating film 14 is made thicker than those used in digital semiconductor integrated circuits such as memory devices and logic circuits, for example, for ensuring the withstand voltage required for power electronics application.

A second gate electrode 37 is provided across the surface opposite to the major surface of the silicon substrate 2. The buried insulating layer 3 also serves as a second gate insulating film associated with the second gate electrode 37. The second gate electrode 37 may be selectively provided at least on a portion opposite to the base region 4. In this case, however, an accuracy of alignment is required. In this embodiment, the second gate electrode 37 is provided across the surface opposite to the major surface of the silicon substrate 2 from the aspect of ease of production.

An interlayer insulating film 39 covering the first gate electrode 15 is provided on the SOI layer 20. A contact opening for exposing part of the source regions 5 and part of the base contact regions 6 is formed in the interlayer insulating film 39. A source electrode 41 in contact with the source regions 5 and base contact regions 6 is provided via this contact opening. That is, the source regions 5 and base contact regions 6 are both connected to the source electrode 41, and the base contact regions 6 serve to fix the potential of the base region 4 to the source potential.

A contact opening for exposing part of the drain region 7 is also formed in the interlayer insulating film 39. A drain electrode 42 in contact with the drain region 7 is provided via this contact opening.

The drift region 18 is made of p$^-$-type or n$^-$-type silicon having a higher resistance than the p-type base region 4 and serves to increase the source-drain withstand voltage and decrease the gate-drain capacitance (Cgd) and source-drain capacitance (Csd). The SOI layer 20 has a thickness of as thin as 0.1 micrometer (μm), for example, in order to reduce the gate-drain capacitance (Cgd), source-drain capacitance (Csd), and drain-second gate capacitance (Cg2). The capacitance between the output terminals can be expressed as the sum of the source-drain capacitance (Csd), gate-drain capacitance (Cgd), and drain-second gate capacitance (Cg2) when the signal is turned off (turn-off time). Among these capacitances, the gate-drain capacitance (Cgd) and source-drain capacitance (Csd) account for a large proportion.

Furthermore, in this embodiment, a hollow portion 38 is provided in a part of the silicon substrate 2. The hollow portion 38 is surrounded by the second major surface (the surface being on the other side of the first major surface that the SOI layer 20 is formed) of the buried insulating layer 3 and the silicon substrate 2. The hollow portion 38 is in contact with the portion of the second major surface of the buried insulating layer 3 that is opposed to the drain region 7 and the drift region 18. If the hollow portion 38 is provided in a portion opposite to the base region 4, the production of a second channel ch2 by the second gate electrode 37 is disturbed. It is desirable that the hollow portion 38 is not provided in the portion opposite to the base region 4. However, the hollow portion 38 may be slightly opposed to the base region 4 in the degree that does not influence the production of the channel ch2 because of production tolerance.

Figure 21:
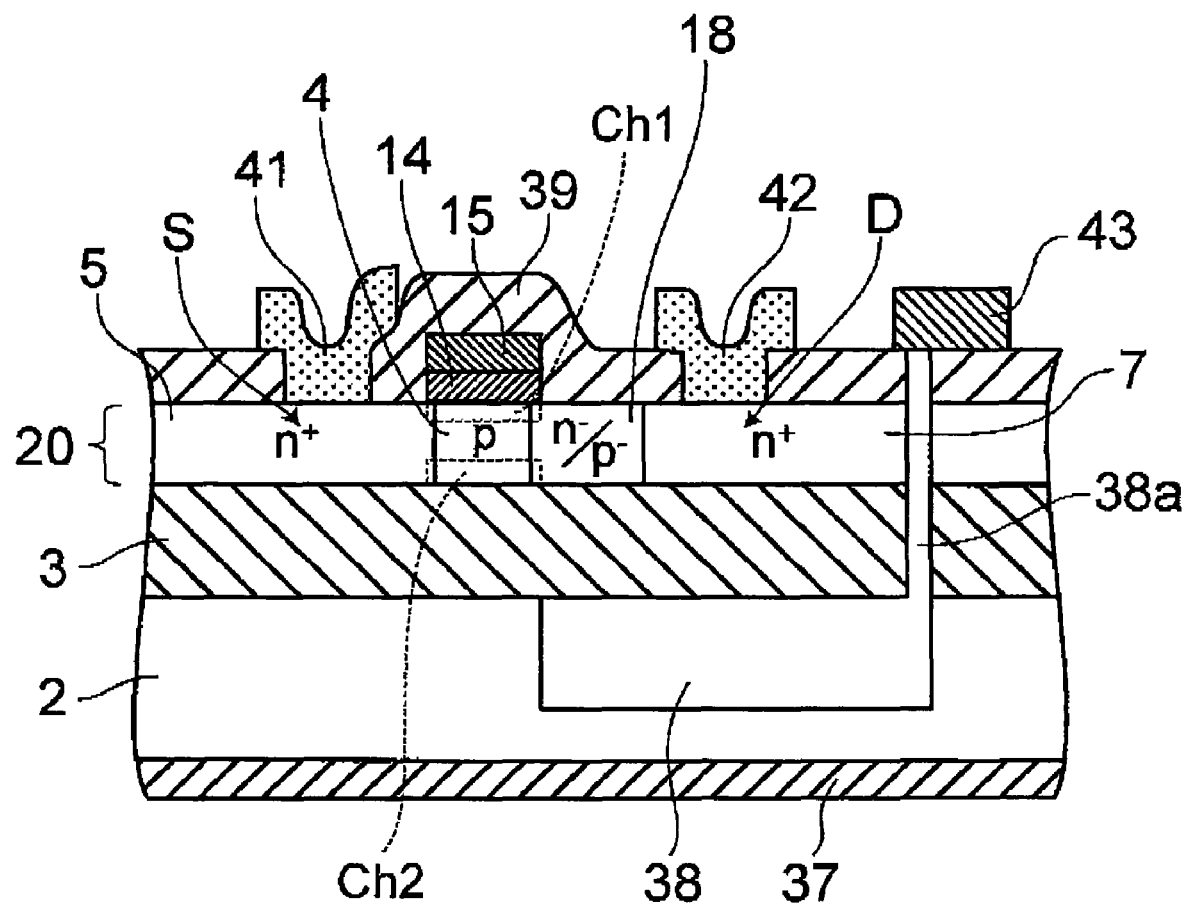
FIG. 21 is a view illustrating a method of forming a hollow portion in the transistor according to the fifth embodiment of the invention.

FIG. 21 is a view illustrating the method of forming the hollow portion 38.

Before the buried insulating layer 3 is provided on the silicon substrate 2, the portion in the silicon substrate 2 where the hollow portion 38 is to be formed is etched away and then filled with a sacrifice layer by SOG (Spin On Glass) method, for example. Subsequently, the buried insulating layer 3 and SOI layer 20 are formed. Then a via 38a that reaches the sacrifice layer through the layers thereon is formed, and the sacrifice layer is etched away through the via 38a to form the hollow portion 38. The opening of the via 38a is then sealed with a sealant 43 such as resin. The hollow portion 38 may be filled with air. Alternatively, sealing with the sealant 43 can be conducted in an atmosphere of inert gas such as nitrogen or argon gas to fill the hollow portion 38 with that inert gas.

In this embodiment, when a prescribed voltage is applied to the first gate electrode 15, a first channel ch1 is produced on the gate insulating film 14 side of the p-type base region 4. Furthermore, when a prescribed voltage is applied to the second gate electrode 37, a second channel ch2 is produced on the buried insulating layer 3 side of the p-type base region 4. That is, channels can be produced on both sides of the base region 4 at the device turn-on time, and hence a low on-resistance is achieved.

Moreover, in this embodiment, the dielectric portion underlying the drain region 7 is thickened by the hollow portion 38 provided in the silicon substrate 2 below the drain region 7. This enables the source-drain withstand voltage at the device turn-off time to be improved. Furthermore, this allows for reducing capacitance between the drain region 7 and the second gate electrode 37 and thereby reducing the output capacitance and CR product.

For example, the gate insulating film 14 has a thickness of 0.14 micrometer (μm), and the buried insulating layer 3 has a thickness comparable thereto (0.14 micrometer) or more (about 3 micrometers). When the buried insulating layer 3 is thicker than the gate insulating film 14, the threshold Vth2 for turning the second channel ch2 into the conduction state (on-state) by applying a positive voltage to the second gate electrode 37 and drain electrode 42 is larger than the threshold Vth1 for turning the first channel ch1 into the conduction state (on-state) by applying a positive voltage to the first gate electrode 15 and drain electrode 42. For example, Vth2 is four or more times larger than Vth1.

SIXTH EMBODIMENT

Figure 22:
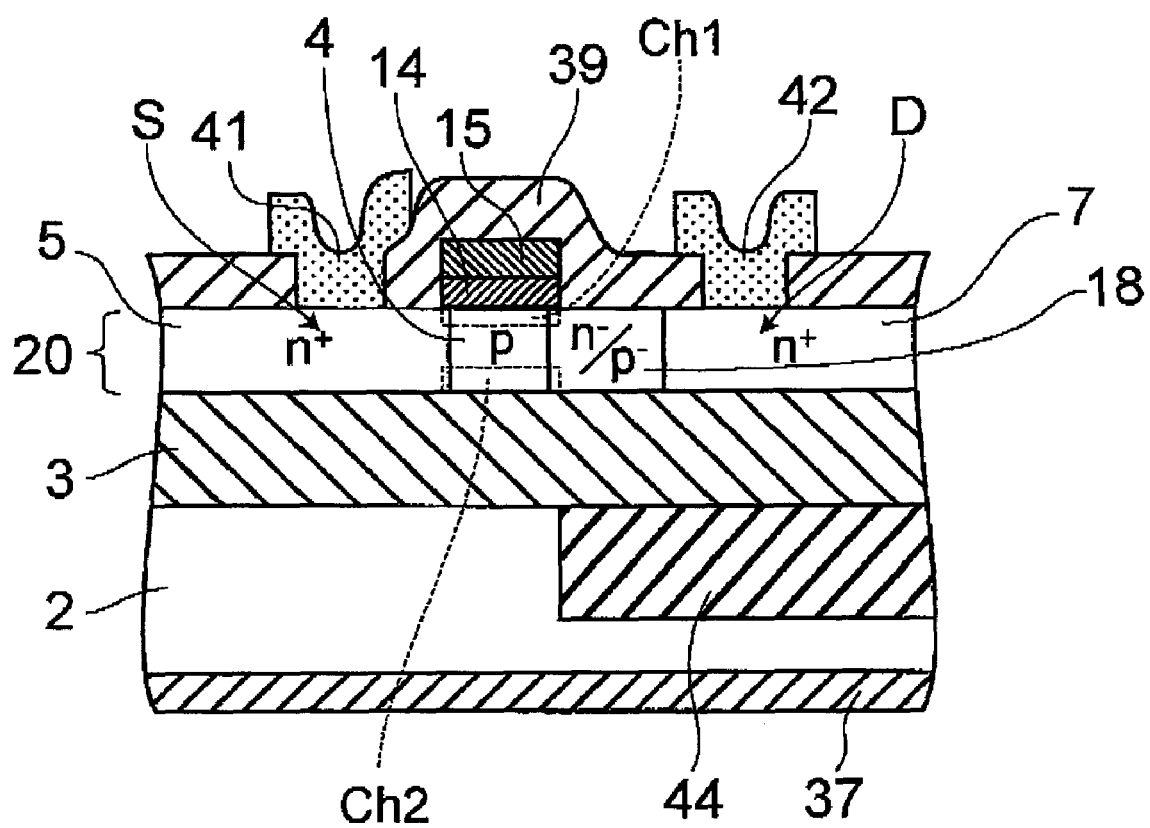
FIG. 22 is a view illustrating a cross-sectional structure of a transistor according to a sixth embodiment of the invention.

FIG. 22 is a view illustrating the cross-sectional structure of a transistor according to a sixth embodiment of the invention.

In this embodiment, an insulating layer 44 is provided in a part of the silicon substrate 2. The insulating layer 44 is surrounded by the second major surface of the buried insulating layer 3 and the silicon substrate 2. The insulating layer 44 is in contact with the portion of the second major surface of the buried insulating layer 3 that is opposed to the drain region 7 and the drift region 18. If the insulating layer 44 is provided in a portion opposite to the base region 4, the production of a second channel ch2 by the second gate electrode 37 is disturbed. It is desirable that the insulating layer 44 is not provided in the portion opposite to the base region 4. However, the insulating layer 44 may be slightly opposed to the base region 4 in the degree that does not influence the production of the channel ch2 because of production tolerance.

The insulating layer 44 is made of silicon oxide. The silicon oxide is buried in a hollow formed in the silicon substrate 2 by SOG method, for example.

In this embodiment as well, the dielectric portion underlying the drain region 7 is thickened by the insulating layer 44 provided in the silicon substrate 2 below the drain region 7. This enables the source-drain withstand voltage at the device turn-off time to be improved. Furthermore, this allows for reducing capacitance between the drain region 7 and the second gate electrode 37 and thereby reducing the output capacitance and CR product.

SEVENTH EMBODIMENT

Figure 23:
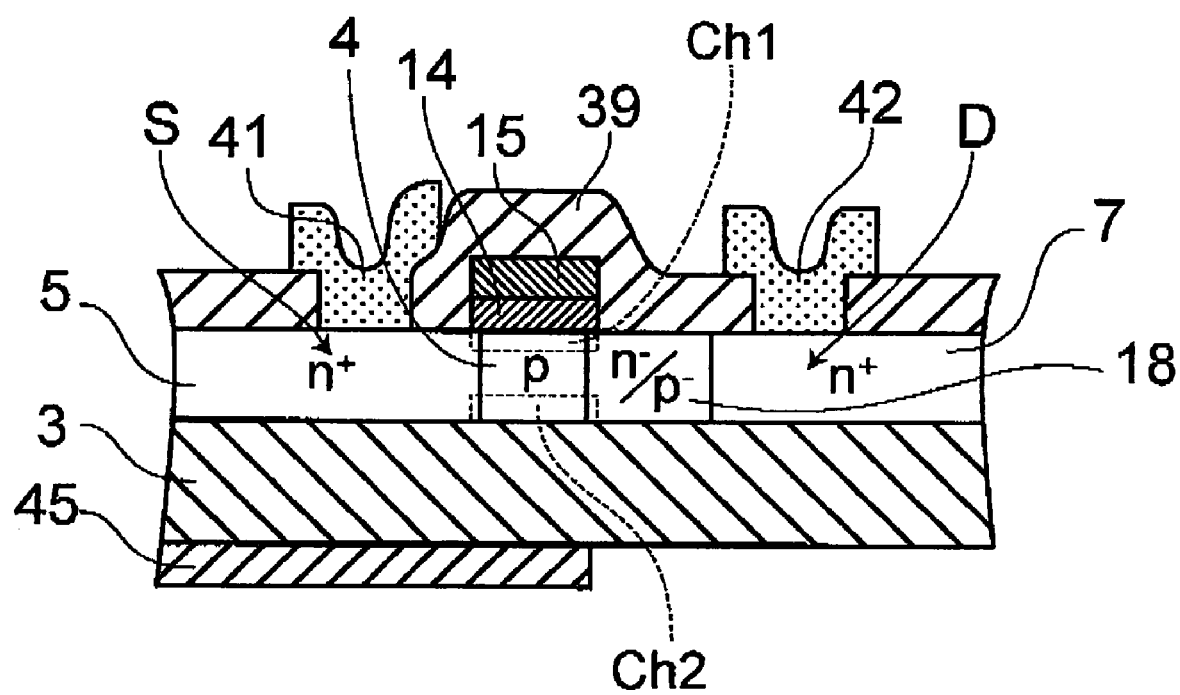
FIG. 23 is a view illustrating a cross-sectional structure of a transistor according to a seventh embodiment of the invention.

FIG. 23 is a view illustrating the cross-sectional structure of a transistor according to a seventh embodiment of the invention.

In this embodiment, after the SOI structure, source portion S, base region 4, drift region 18, drain portion D, gate insulating film 14, gate electrode 15, source electrode 41, and drain electrode 42 are formed, the supporting substrate is removed. A second electrode 45 is then provided on a second major surface of the buried insulating layer 3 that is exposed upon removal of the supporting substrate.

The second electrode 45 is provided on the portion in the second major surface of the buried insulating layer 3 that is opposed to the base region 4 and source region 5. Because the second electrode 45 is not provided on the portion opposite to the drain region 7, the capacitance between the drain region 7 and the second gate electrode 45 is reduced. This allows for reducing the output capacitance and CR product. If the second electrode 45 is provided on the portion opposite to the drift region 18, the second channel ch2 can be extended to the drift region 18 when a gate voltage is applied to the second gate electrode 45. This enables a low on-resistance. However, if the second gate electrode 45 gets near to the drain region 7, the capacitance between the drain region 7 and the second gate electrode 45 may increase.

EIGHTH EMBODIMENT

Figure 24:
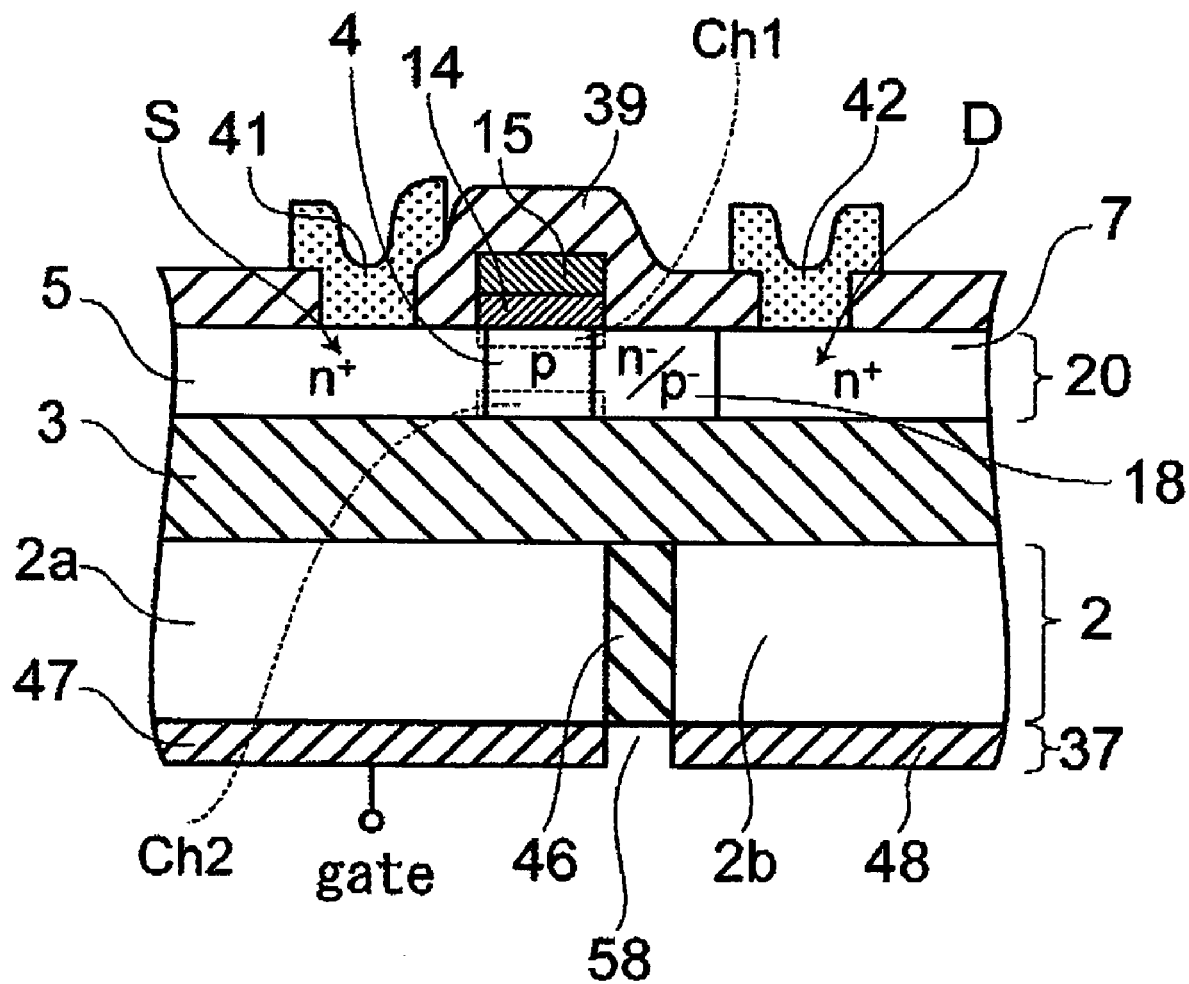
FIG. 24 is a view illustrating a cross-sectional structure of a transistor according to an eighth embodiment of the invention.

FIG. 24 is a view illustrating the cross-sectional structure of a transistor according to an eighth embodiment of the invention.

In this embodiment, an insulating layer 46 for insulatively separating the silicon substrate 2 into a first portion 2a and a second portion 2b is provided on the second major surface of the buried insulating layer 3. The insulating layer 46 is provided on the portion opposed to the drift region 18 and insulatively separates the silicon substrate 2 into the first portion 2a, which is opposed to the source region 5 and base region 4, and the second portion 2b, which is opposed to the drain region 7. The insulating layer 46 is made of silicon oxide, for example. Alternatively, a hollow portion may be provided instead of the insulating layer 46.

Furthermore, after a conductive film 37 is formed across the rear side of the silicon substrate 2, a splitting groove 58 is formed by etching, for example, to insulatively separate the conductive film 37 into a first portion 47 and a second portion 48 along the position of the insulating layer 46. The first portion 47 of the conductive film 37 serves as a second gate electrode to which a gate voltage is applied. No voltage is applied to the second portion 48 of the conductive film 37. The insulating layer (dielectric substance) 46 is provided between the second gate electrode 47 and the drain region 7. This allows for reducing parasite capacitance between the drain and the second gate and thereby reducing the output capacitance and CR product.

NINTH EMBODIMENT

Figure 25:
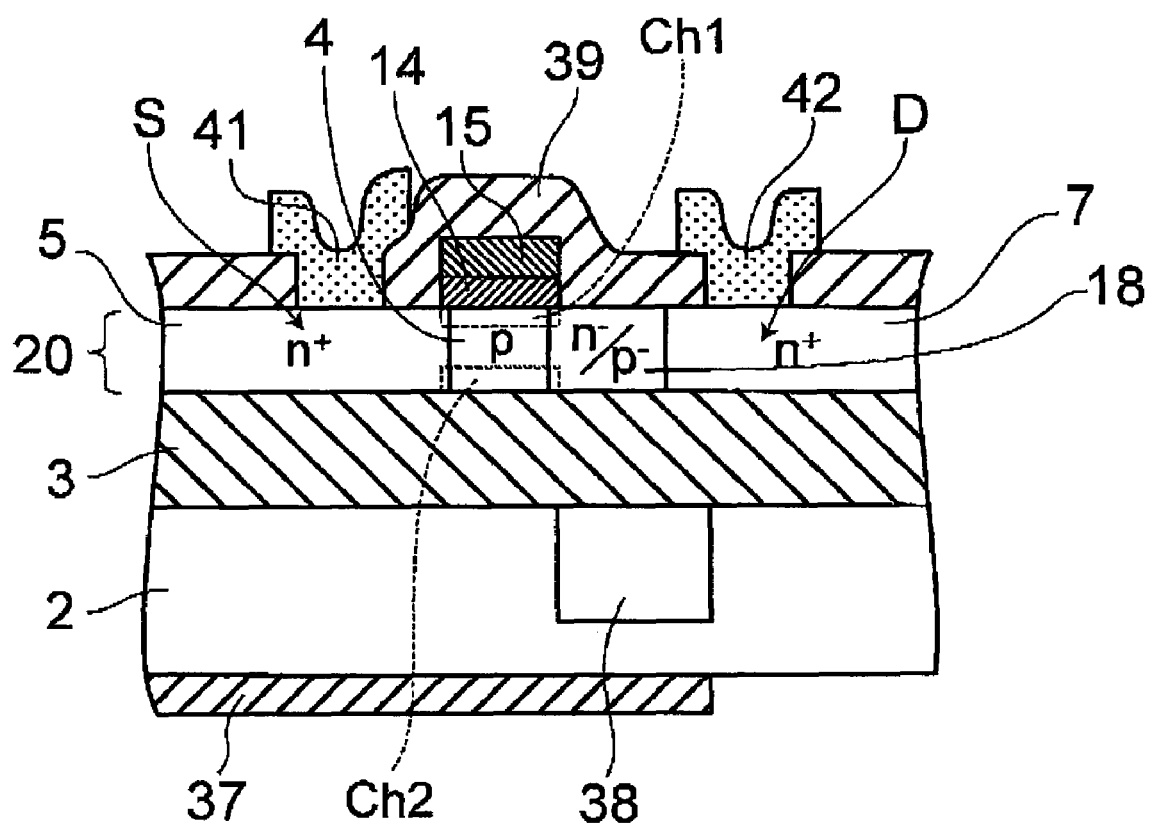
FIG. 25 is a view illustrating a cross-sectional structure of a transistor according to a ninth embodiment of the invention.

FIG. 25 is a view illustrating the cross-sectional structure of a transistor according to a ninth embodiment of the invention.

The hollow portion 38 in the fifth embodiment described above with reference to FIG. 20 may not extend across the portion opposed to the drift region 7, but may be provided only below the drift region 18 and below the portion of the drain region 7 near the junction with the drift region 18 as in this embodiment shown in FIG. 25. If the hollow portion 38 is provided between the second gate electrode 37 and the drain region 7, the parasite capacitance between the drain and the second gate can be reduced and the output capacitance and CR product can be reduced.

TENTH EMBODIMENT

Figure 26:
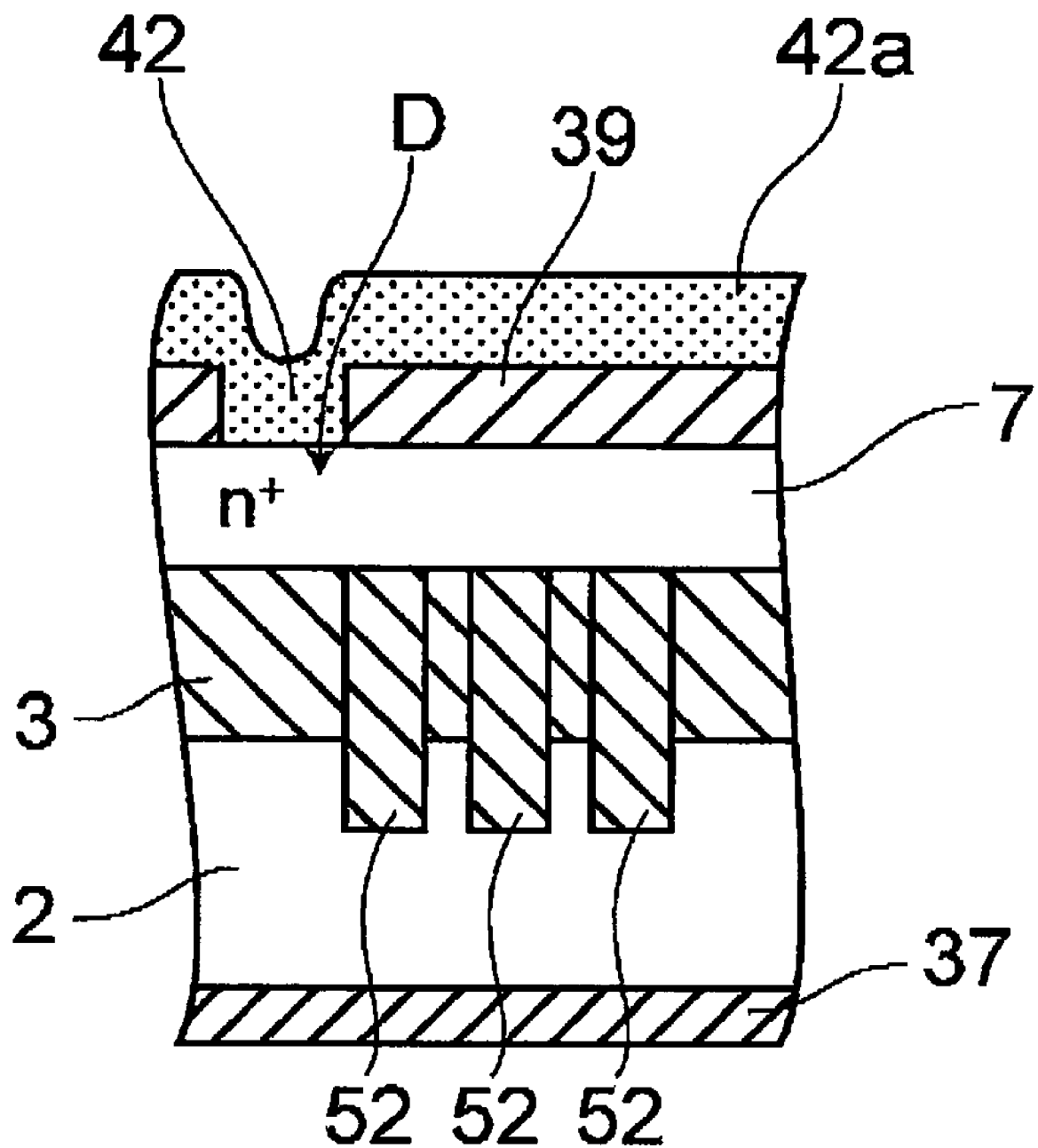
FIG. 26 is a view illustrating a cross-sectional structure of an end portion of a transistor according to a tenth embodiment of the invention.

FIG. 26 is a view illustrating the cross-sectional structure of a end portion of a transistor according to a tenth embodiment of the invention.

The cross-sectional structure of the device portion of the above transistors according to the fifth to ninth embodiments is illustrated in FIGS. 20 to 25. Those transistors may have the end portion structure illustrated in FIG. 26, for example.

A plurality of insulating layers 52 are provided between the pad 42a of the drain electrode 42 and the second gate electrode 37. The plurality of insulating layers 52 are provided in the end portion. The insulating layers 52 are spaced apart from each other in the direction parallel to the major surface of the silicon substrate 2 and each thicker than the buried insulating layer 3. The insulating layers 52 can be formed by, for example, providing the buried insulating layer 3 on the silicon substrate 2, forming a plurality of trenches that pass through the buried insulating layer 3 and reach halfway the silicon substrate 2, and filling the trenches with silicon oxide, for example. The insulating layers 52 allow for reducing the parasite capacitance between the drain pad in the end portion and the second gate and thereby reducing the output capacitance and CR product.

ELEVENTH EMBODIMENT

Figure 27:
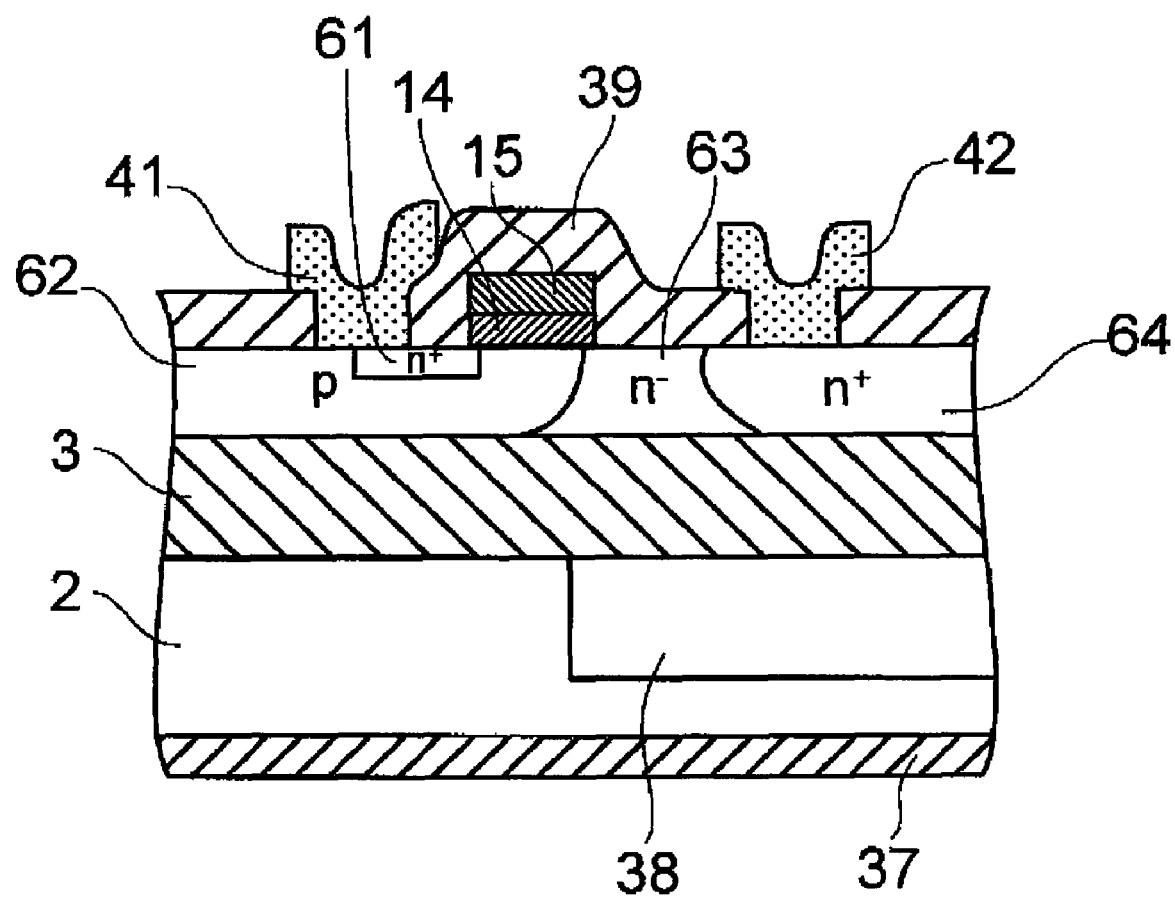
FIG. 27 is a view illustrating a cross-sectional structure of a transistor according to an eleventh embodiment of the invention.

FIG. 27 is a view illustrating the cross-sectional structure of a transistor according to an eleventh embodiment of the invention.

This embodiment is different from the fifth embodiment described above with reference to FIG. 20 in the structure of the source region 61, base region 62, drift region 63, and drain region 64 on the buried insulating layer 3. More specifically, the source region 61 is selectively formed in the surface of the base region 62, and the source region 61 overlaps the base region 62 in the thickness direction.

Figure 28:
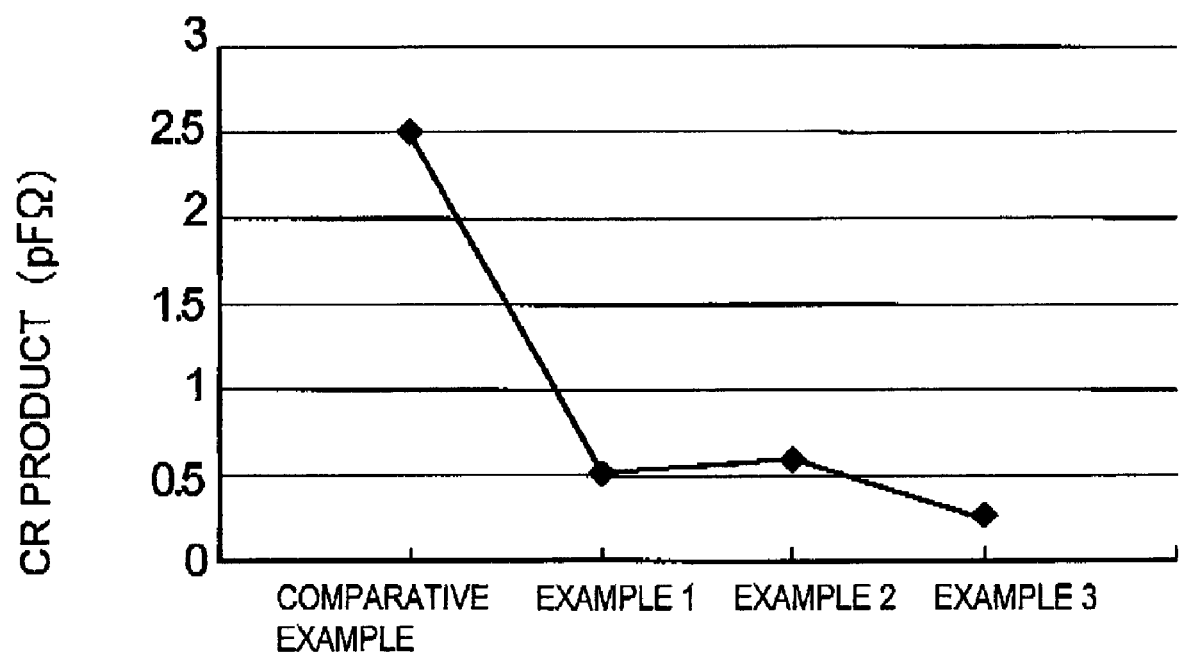
FIG. 28 is a graphical diagram showing the result of comparing the CR product between the structures of the embodiments of the invention and the structure of the comparative example.

FIG. 28 is a graphical diagram showing the result of comparing the CR product between the structures of the embodiments of the invention and the structure of the comparative example.

On the horizontal axis of the graph, Example 1 corresponds to the structure of the fifth embodiment shown in FIG. 20, Example 2 corresponds to the seventh embodiment shown in FIG. 23, and Example 3 corresponds to the eighth embodiment shown in FIG. 24. The comparative example corresponds to the structure of the fifth embodiment shown in FIG.

20 except that the hollow portion 38 is not provided. In the comparative example and Examples 1 to 3, the drain-source withstand voltage is 20 (V), the gate voltage Vg is 40 (V), the substrate voltage is 80 (V), and the drain current Id is 0.1 (A).

Table 1 shows the on-resistance Ron (Ω), drain-source withstand voltage Vdss (V), drain-substrate capacitance (pF), output capacitance Cout (pF), and CR product (pF Ω).

|  | Ron (Ω) | Vdss (V) | DRAIN-SUBSTRATE CAPACITANCE (pF) | Cout (pF) | CR PRODUCT (pFΩ) |
|---|---|---|---|---|---|
| EXAMPLE 1 | 0.45 | 20 | 0.87 | 1.13 | 0.5085 |
| EXAMPLE 2 | 0.53 | 20 | 0.78 | 1.04 | 0.5512 |
| EXAMPLE 3 | 0.59 | 20 | 0.1256 | 0.3856 | 0.227504 |

As shown in the result in FIG. 28, the CR product is 2.5 (pF Ω) for the structure of the comparative example, whereas it can be reduced to about 0.5 (pF Ω) in Examples 1 and 2, and even to 0.25 (pF Ω), which is about 1/10 of the value for the comparative example, in Example 3. The value of 0.25 (pF Ω) is far superior to the limit of silicon MOSFETs now commercially available.

Figure 29:
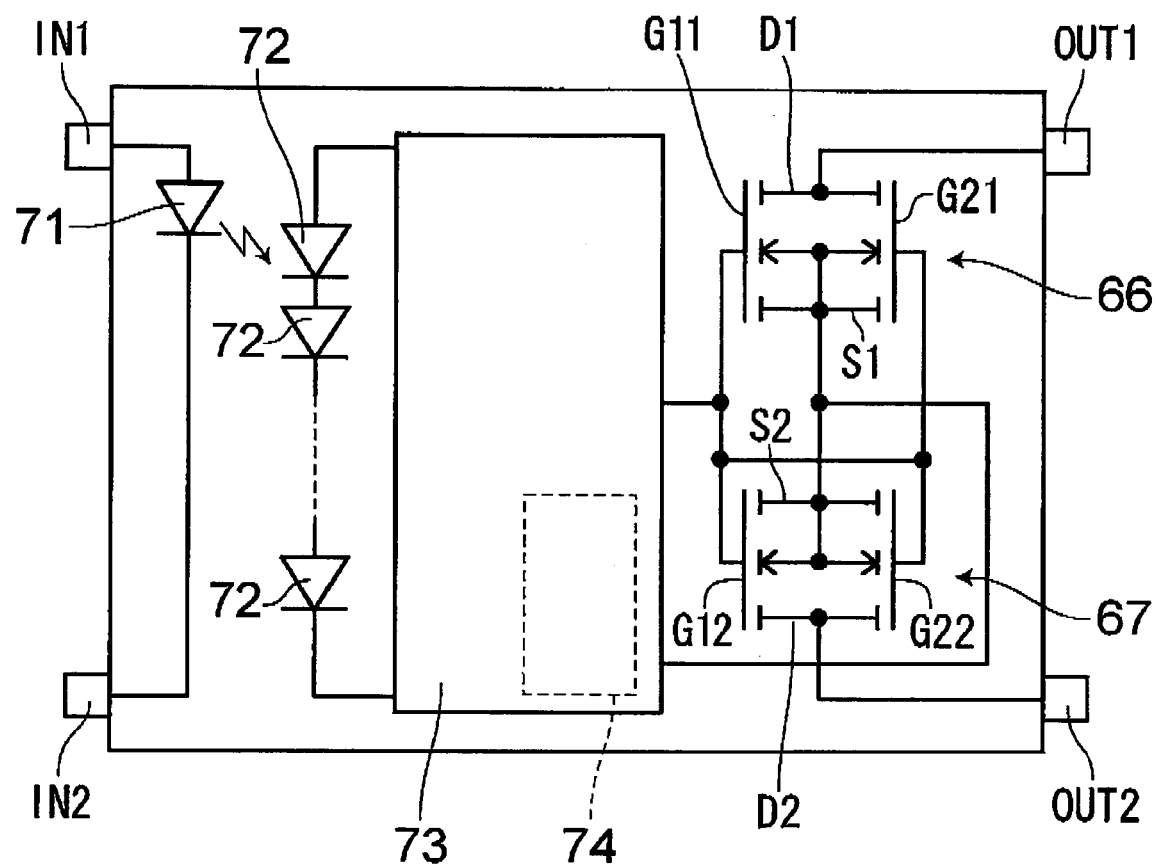
FIG. 29 is a diagram showing a photorelay circuit of the embodiment of the invention.

FIG. 29 is a diagram showing a photorelay circuit in which any of the transistors described above with reference to FIGS. 20 to 27 is used as MOSFET switches 66 and 67.

Between input terminals IN1 and IN2 for receiving a switching control signal, a light emitting device (light emitting diode) 71 for emitting light in response to the switching control signal is connected. A photodiode array 72 (composed of a plurality of series-connected photodiodes) is provided to receive the light emitted by the light emitting device 71 and generate a DC voltage.

A first gate electrode G11 and second gate electrode G21 of the MOSFET switch 66 and a first gate electrode G12 and second gate electrode G22 of the MOSFET switch 67 are connected to each other. These gate electrodes are supplied with the DC voltage outputted from the photodiode array 72 via a control circuit 73. The drain electrodes D1 and D2 of the MOSFET switches 66 and 67 are connected to output terminals OUT1 and OUT2, respectively.

The MOSFET switches 66 and 67 are turned on when a DC voltage outputted from the photodiode array 72 is applied via the control circuit 73 to the gate electrodes G11, G21, G12, and G22 of the MOSFET switches 66 and 67. This turns the output terminals OUT1 and OUT2 into the conduction state. When the switching control signal inputted to the input terminals IN1 and IN2 vanishes, the light emitting device 71 stops emission, which in turn causes the DC voltage that occurred across the photodiode array 72 to vanish. Thus the MOSFET switches 66 and 67 are switched from the on-state to the off-state.

The control circuit 73 includes a discharge circuit 74 that is connected between the gate electrodes G11, G21, G12, and G22 and the source electrodes S1 and S2 of the MOSFET switches 66 and 67. The discharge circuit 74 serves to rapidly discharge electric charges stored between the gates and sources when the MOSFET switches 66 and 67 are switched from the on-state to the off-state.

One of the major applications of semiconductor relays is a measuring instrument such as an LSI tester. In such a measuring instrument, the frequency of signals turned on and off between the output terminals OUT1 and OUT2 has become higher. It is therefore desired to reduce capacitance between the output terminals OUT1 and OUT2 at the turn-off time in addition to reducing on-resistance between the output terminals OUT1 and OUT2 at the turn-on time.

In this embodiment, any of the transistors described above with reference to FIGS. 20 to 27 can be used as the MOSFET switches 66 and 67 to reduce on-resistance and off-capacitance while achieving a high withstand voltage.

The fifth to tenth embodiments described above with reference to FIGS. 20 to 25 can be combined with the first and second embodiments. That is, the $p^+$-type base contact regions 6 can be offset away from the drain region 7 to recede relative to the $n^+$-type source regions 5. This allows for ensuring an effective channel area in the on-state, thereby preventing the increase of on-resistance and achieving a high withstand voltage due to Lch (channel length)/W(Ns) (width of the source region 5)$\geq$1.5.

The switching withstand value can be further improved by setting the width W(Ns) of the source region 5 to 1 micrometer or less as described above with reference to FIG. 7 while satisfying Lch/W(Ns)$\geq$1.5.

The drift region 18 according to the fifth to ninth embodiments may have n-type stripe regions 18a and p-type stripe regions 18b alternately as shown in FIGS. 10A and 10B.

Embodiments of the invention have been described with reference to the examples. However, the invention is not limited to these examples.

For example, any size, material, and arrangement of various elements constituting the field effect transistors and photorelays that are variously adapted by those skilled in the art are also encompassed within the scope of the invention as long as they include the features of the invention.

The invention claimed is:

1. A transistor comprising:
   an insulating layer;
   a semiconductor layer provided on a major surface of the insulating layer, the semiconductor layer having
      a source portion having a plurality of source regions of a first conductivity type and a plurality of base contact regions of a second conductivity type, the source regions being alternated with the base contact regions,
      a drain portion of the first conductivity type, and
      a base region of the second conductivity type provided between the source portion and the drain portion, the base region being in contact with the source regions and the base contact regions;
   a gate insulating layer provided on the base region; and
   a gate electrode provided on the gate insulating layer,
   a distance between the source regions and the drain portion being smaller than a distance between the base contact regions and the drain portion.

2. A transistor according to claim 1, wherein the junction between the source regions and the base region are closer to the drain portion side than the junction between the base contact regions and the base region by no less than 0.15 micrometer and no more than 0.3 micrometer.

3. A transistor according to claim 1, wherein the source region has a width of 1 micrometer or less, which is measured perpendicular to the direction connecting the source portion to the drain portion.

4. A transistor according to claim 1, further comprising a drift region provided between the base region and the drain portion, the drift region being depleted in a turn-off state.

5. A transistor comprising:
   a supporting substrate;
   an insulating layer provided on a major surface of the supporting substrate, the insulating layer having a first major surface and a second major surface that is in contact with the major surface of the supporting substrate;

a semiconductor layer provided on the first major surface of the insulating layer, the semiconductor layer having a source portion, a drain portion of a first conductivity type, and a base region of a second conductivity type provided between the source portion and the drain portion;

a gate insulating layer provided on the base region;

a first gate electrode provided on the gate insulating layer;

a second gate electrode provided on a surface of the supporting substrate, the surface being in the opposite side of the major surface of the supporting substrate; and a dielectric substance provided in a part of the supporting substrate, the dielectric substance being in contact with a portion in the second major surface of the insulating layer, the portion being opposed to the drain portion.

6. A transistor according to claim 5, wherein the dielectric substance is a hollow portion surrounded by the insulating layer and the supporting substrate.

7. A transistor according to claim 5, wherein the source portion has a plurality of source regions of the first conductivity type being in contact with the base region and a plurality of base contact regions of the second conductivity type being in contact with the base region, and the source regions are alternated with the base contact regions.

8. A transistor according to claim 7, wherein the junction between the source regions and the base region are closer to the drain portion side than the junction between the base contact regions and the base region.

9. A transistor according to claim 7, wherein the junction between the source regions and the base region are closer to the drain portion side than the junction between the base contact regions and the base region by no less than 0.15 micrometer and no more than 0.3 micrometer.

10. A transistor according to claim 7, wherein the source region has a width of 1 micrometer or less, which is measured perpendicular to the direction connecting the source portion to the drain portion.

11. A transistor according to claim 5, further comprising a drift region provided between the base region and the drain portion, the drift region being depleted in a turn-off state.

12. A transistor comprising:

an insulating layer having a first major surface and a second major surface that is on the opposite side of the first major surface;

a semiconductor layer provided on the first major surface of the insulating layer, the semiconductor layer having a source portion, a drain portion of a first conductivity type, and a base region of a second conductivity type provided between the source portion and the drain portion; a gate insulating layer provided on the base region;

a first gate electrode provided on the gate insulating layer; and a second gate electrode provided on the second major surface of the insulating layer not on a portion in the second major surface that is opposed to the drain portion but on a portion in the second major surface that is opposed to the base region.

13. A transistor according to claim 12, wherein the second gate electrode is provided on the second major surface of the insulating layer.

14. A transistor according to claim 12, further comprising:

a supporting substrate provided on the second major surface of the insulating layer, wherein the second gate electrode is provided on a surface in the supporting substrate, the surface being on the opposite side of a surface that the insulating layer is provided on.

15. A transistor comprising:

an insulating layer having a first major surface and a second major surface that is on the opposite side of the first major surface;

a semiconductor layer provided on the first major surface of the insulting layer, the semiconductor layer having source portion, a drain portion of a first conductivity type, and a base region of a second conductivity type provided between the source portion and the drain potion;

a gate insulating layer provided on the base region;

a first gate electrode provided on the gate insulating layer;

a second gate electrode provided not on a portion in the second major surface side of the insulating layer that is opposed to the drain portion but on a portion in the second major surface side of the insulating layer that is opposed to the base region;

a supporting substrate provided on the second major surface of the insulating layer; and a dielectric substance provided between the second gate electrode and the drain portion in the substrate, wherein the second gate electrode is provided on a surface in the supporting substrate, the surface being on the opposite side of a surface that the insulation is provided on.

16. A transistor according to claim 12, wherein the source portion has a plurality of source regions of the first conductivity type being in contact with the base region and a plurality of base contact regions of the second conductivity type being in contact with the base region, and the source regions are alternated with the base contact regions.

17. A transistor according to claim 16, wherein the junction between the source regions and the base region are closer to the drain portion side than the junction between the base contact regions and the base region.

18. A transistor according to claim 16, wherein the junction between the source regions and the base region are closer to I the drain portion side than the junction between the base contact regions and the base region by no less than 0.15 micrometer and no more than 0.3 micrometer.

19. A transistor according to claim 16, wherein the source region has a width of 1 micrometer or less, which is measured perpendicular to the direction connecting the source portion to the drain portion.

20. A transistor according to claim 12, further comprising a drift region provided between the base region and the drain portion, the drift region being depleted in a turn-off state.

* * * * *

UNITED STATES PATENT AND TRADEMARK OFFICE
CERTIFICATE OF CORRECTION

PATENT NO. : 7,489,018 B2  Page 1 of 1
APPLICATION NO. : 11/405672
DATED : February 10, 2009
INVENTOR(S) : Mitsuhiko Kitagawa et al.

It is certified that error appears in the above-identified patent and that said Letters Patent is hereby corrected as shown below:

In Column 22, Claim 15, Line 20:
    Please replace "potion;" with --portion;--

Signed and Sealed this

Eighteenth Day of August, 2009

David J. Kappos
*Director of the United States Patent and Trademark Office*